(12) United States Patent
Dunn et al.

(10) Patent No.: US 12,393,069 B2
(45) Date of Patent: Aug. 19, 2025

(54) SELF-CONTAINED ELECTRONIC DISPLAY ASSEMBLY, MOUNTING STRUCTURE AND METHODS FOR THE SAME

(71) Applicant: Manufacturing Resources International, Inc., Alpharetta, GA (US)

(72) Inventors: William Dunn, Alpharetta, GA (US); Marcos Diaz, Alpharetta, GA (US); Andrew Lincoln, Atlanta, GA (US)

(73) Assignee: Manufacturing Resources International, Inc., Alpharetta, GA (US)

( * ) Notice: Subject to any disclaimer, the term of this patent is extended or adjusted under 35 U.S.C. 154(b) by 0 days.

(21) Appl. No.: 18/962,069

(22) Filed: Nov. 27, 2024

(65) Prior Publication Data

US 2025/0093691 A1    Mar. 20, 2025

Related U.S. Application Data

(60) Continuation of application No. 18/750,389, filed on Jun. 21, 2024, now Pat. No. 12,197,058, which is a
(Continued)

(51) Int. Cl.
| | |
|---|---|
| *G02F 1/1333* | (2006.01) |
| *G02F 1/13357* | (2006.01) |
| *H05K 7/20* | (2006.01) |

(52) U.S. Cl.
CPC .. *G02F 1/133308* (2013.01); *G02F 1/133342* (2021.01); *G02F 1/133385* (2013.01); *H05K 7/20972* (2013.01); *G02F 1/133602* (2013.01)

(58) Field of Classification Search
None
See application file for complete search history.

(56) References Cited

U.S. PATENT DOCUMENTS

| | | |
|---|---|---|
| 2,029,221 A | 1/1936 | Burgess et al. |
| 2,678,860 A | 5/1954 | Peterson |
| (Continued) | | |

FOREIGN PATENT DOCUMENTS

| | | |
|---|---|---|
| AU | 2011248190 B2 | 5/2011 |
| AU | 2014287438 B2 | 1/2018 |
| (Continued) | | |

OTHER PUBLICATIONS

Mentley, David E., State of Flat-Panel Display Technology and Future Trends, Proceedings of the IEEE, Apr. 2002, vol. 90, No. 4, pp. 453-459.
(Continued)

*Primary Examiner* — Richard H Kim
(74) *Attorney, Agent, or Firm* — Standley Law Group LLP; Jeffrey S. Standley; Adam J. Smith

(57) ABSTRACT

Display assemblies and related systems and methods for mounting are provided. A side assembly with electronic display and a mounting device positioned, at least in part, rearward of the electronic display having laterally extending portion and hooked portions facing, at least primarily, in a first direction is raised relative to another mounting device with hooked portions facing, at least primarily, in a second, opposing direction. The side assembly is raised so that the hooked portions of said additional mounting device clear the hooked portions of the mounting device as the side assembly is moved laterally rearward to at least partially overlap the hooked portions of the mounting device and the additional mounting device. The side assembly is lowered to engage hooked portions of the additional mounting device and the mounting device.

20 Claims, 22 Drawing Sheets

Related U.S. Application Data division of application No. 18/233,525, filed on Aug. 14, 2023, now Pat. No. 12,072,561, which is a continuation-in-part of application No. 17/870,913, filed on Jul. 22, 2022, now Pat. No. 12,010,813.

(56) References Cited

U.S. PATENT DOCUMENTS

| | | |
|---|---|---|
| 3,587,186 A | 6/1971 | Lane |
| 3,757,218 A | 9/1973 | Oliverio et al. |
| 3,984,931 A | 10/1976 | Belokin, Jr. |
| 4,093,355 A | 6/1978 | Kaplit et al. |
| 4,169,327 A | 10/1979 | Stilling |
| 4,187,058 A | 2/1980 | Fish |
| 4,267,657 A | 5/1981 | Kloke |
| 4,292,370 A | 9/1981 | Pekko |
| 4,327,513 A | 5/1982 | de Gunzburg |
| 4,452,000 A | 6/1984 | Gandy |
| 4,547,987 A | 10/1985 | Stilling |
| 4,593,978 A | 6/1986 | Mourey et al. |
| 4,634,225 A | 1/1987 | Haim et al. |
| 4,748,765 A | 6/1988 | Martin |
| 4,759,143 A | 7/1988 | Pomerleau |
| 4,763,993 A | 8/1988 | Vogeley et al. |
| 4,792,881 A | 12/1988 | Wilson et al. |
| 4,817,317 A | 4/1989 | Kovalak, Jr. |
| 4,903,221 A | 2/1990 | Krenz |
| 4,903,423 A | 2/1990 | Hinca |
| 4,905,390 A | 3/1990 | Stilling |
| 4,921,041 A | 5/1990 | Akachi |
| 4,952,783 A | 8/1990 | Aufderheide et al. |
| 4,952,925 A | 8/1990 | Haastert |
| 4,976,536 A | 12/1990 | Vogeley et al. |
| 5,025,355 A | 6/1991 | Harwood |
| 5,029,982 A | 7/1991 | Nash |
| 5,088,806 A | 2/1992 | McCartney et al. |
| 5,132,666 A | 7/1992 | Fahs |
| 5,150,231 A | 9/1992 | Iwamoto et al. |
| 5,179,367 A | 1/1993 | Shimizu |
| 5,247,374 A | 9/1993 | Terada |
| 5,255,029 A | 10/1993 | Vogeley et al. |
| 5,282,114 A | 1/1994 | Stone |
| 5,285,677 A | 2/1994 | Oehler |
| 5,293,930 A | 3/1994 | Pitasi |
| 5,299,109 A | 3/1994 | Grondal |
| 5,351,176 A | 9/1994 | Smith et al. |
| 5,423,142 A | 6/1995 | Douglas et al. |
| 5,432,526 A | 7/1995 | Hyatt |
| 5,457,905 A | 10/1995 | Kaplan |
| 5,493,802 A | 2/1996 | Simson |
| 5,535,816 A | 7/1996 | Ishida |
| D373,120 S | 8/1996 | Andre et al. |
| 5,559,614 A | 9/1996 | Urbish et al. |
| 5,621,614 A | 4/1997 | O'Neill |
| 5,657,641 A | 8/1997 | Cunningham et al. |
| 5,717,424 A | 2/1998 | Simson et al. |
| 5,748,269 A | 5/1998 | Harris et al. |
| 5,755,050 A | 5/1998 | Aiken |
| 5,765,743 A | 6/1998 | Sakiura et al. |
| 5,767,489 A | 6/1998 | Ferrier |
| 5,803,424 A | 9/1998 | Keehn et al. |
| 5,808,418 A | 9/1998 | Pitman et al. |
| 5,818,010 A | 10/1998 | McCann |
| 5,818,694 A | 10/1998 | Daikoku et al. |
| 5,835,179 A | 11/1998 | Yamanaka |
| 5,864,465 A | 1/1999 | Liu |
| 5,869,818 A | 2/1999 | Kim |
| 5,869,919 A | 2/1999 | Sato et al. |
| 5,899,027 A | 5/1999 | St. Louis |
| 5,903,433 A | 5/1999 | Gudmundsson |
| 5,920,367 A | 7/1999 | Kajimoto et al. |
| D415,736 S | 10/1999 | Witte |
| 5,991,153 A | 11/1999 | Heady et al. |
| 6,003,015 A | 12/1999 | Kang et al. |
| 6,007,205 A | 12/1999 | Fujimori |
| 6,043,979 A | 3/2000 | Shim |
| 6,050,833 A | 4/2000 | Danzyger et al. |
| 6,089,751 A | 7/2000 | Conover et al. |
| 6,104,451 A | 8/2000 | Matsuoka et al. |
| 6,125,565 A | 10/2000 | Hillstrom |
| 6,157,432 A | 12/2000 | Helbing |
| 6,172,869 B1 | 1/2001 | Hood, III et al. |
| 6,181,070 B1 | 1/2001 | Dunn et al. |
| 6,191,839 B1 | 2/2001 | Briley et al. |
| 6,198,222 B1 | 3/2001 | Chang |
| 6,204,906 B1 | 3/2001 | Tannas, Jr. |
| 6,211,934 B1 | 4/2001 | Habing et al. |
| 6,215,655 B1 | 4/2001 | Heady et al. |
| 6,231,446 B1 | 5/2001 | Majima et al. |
| 6,351,381 B1 | 2/2002 | Bilski et al. |
| 6,359,390 B1 | 3/2002 | Nagai |
| 6,380,999 B1 | 4/2002 | Tannas, Jr. |
| 6,392,727 B1 | 5/2002 | Larson et al. |
| 6,405,463 B1 | 6/2002 | Roddy et al. |
| 6,417,900 B1 | 7/2002 | Shin et al. |
| 6,427,284 B1 | 8/2002 | Harrelson, II et al. |
| 6,428,198 B1 | 8/2002 | Saccomanno et al. |
| 6,437,673 B1 | 8/2002 | Nishida et al. |
| 6,469,752 B1 | 10/2002 | Ishikawa et al. |
| 6,473,150 B1 | 10/2002 | Takushima et al. |
| 6,476,883 B1 | 11/2002 | Salimes et al. |
| D467,561 S | 12/2002 | Kosciolek |
| 6,493,440 B2 | 12/2002 | Gromatsky et al. |
| 6,494,429 B2 | 12/2002 | Tajima |
| 6,504,713 B1 | 1/2003 | Pandolfi et al. |
| 6,535,266 B1 | 3/2003 | Nemeth et al. |
| 6,557,284 B2 | 5/2003 | Nolan |
| 6,628,355 B1 | 9/2003 | Takahara |
| 6,639,571 B2 | 10/2003 | Wang |
| 6,643,130 B1 | 11/2003 | DeMarchis et al. |
| 6,683,639 B2 | 1/2004 | Driessen-Olde Scheper et al. |
| 6,701,143 B1 | 3/2004 | Dukach et al. |
| 6,714,410 B2 | 3/2004 | Wellhofer |
| 6,727,468 B1 | 4/2004 | Nemeth |
| 6,742,583 B2 | 6/2004 | Tikka |
| 6,748,685 B2 | 6/2004 | Peel |
| 6,758,002 B1 | 7/2004 | Duguay |
| 6,812,851 B1 | 11/2004 | Dukach et al. |
| 6,825,828 B2 | 11/2004 | Burke et al. |
| 6,833,992 B2 | 12/2004 | Kusaka et al. |
| 6,839,104 B2 | 1/2005 | Taniguchi et al. |
| 6,850,209 B2 | 2/2005 | Mankins et al. |
| 6,885,412 B2 | 4/2005 | Ohnishi et al. |
| 6,886,942 B2 | 5/2005 | Okada et al. |
| 6,891,135 B2 | 5/2005 | Pala et al. |
| 6,909,486 B2 | 6/2005 | Wang et al. |
| 6,943,768 B2 | 9/2005 | Cavanaugh et al. |
| 6,961,108 B2 | 11/2005 | Wang et al. |
| 6,962,528 B2 | 11/2005 | Yokota |
| 6,976,330 B2 | 12/2005 | Milliken |
| 6,977,627 B1 | 12/2005 | Dalton |
| 7,015,470 B2 | 3/2006 | Faytlin et al. |
| 7,059,757 B2 | 6/2006 | Shimizu |
| 7,083,285 B2 | 8/2006 | Hsu et al. |
| D530,686 S | 10/2006 | Reza |
| 7,157,838 B2 | 1/2007 | Thielemans et al. |
| 7,161,803 B1 | 1/2007 | Heady |
| 7,164,586 B2 | 1/2007 | Lin |
| 7,190,416 B2 | 3/2007 | Paukshto et al. |
| 7,190,587 B2 | 3/2007 | Kim et al. |
| 7,209,349 B2 | 4/2007 | Chien et al. |
| 7,210,839 B2 | 5/2007 | Jung et al. |
| 7,212,403 B2 | 5/2007 | Rockenfell |
| D544,848 S | 6/2007 | Marz et al. |
| 7,226,176 B1 | 6/2007 | Huang |
| 7,259,964 B2 | 8/2007 | Yamamura et al. |
| 7,269,023 B2 | 9/2007 | Nagano |
| 7,284,874 B2 | 10/2007 | Jeong et al. |
| 7,292,435 B2 | 11/2007 | She |
| 7,339,782 B1 | 3/2008 | Landes et al. |
| 7,342,789 B2 | 3/2008 | Hall et al. |
| 7,396,145 B2 | 7/2008 | Wang et al. |
| 7,447,018 B2 | 11/2008 | Lee et al. |
| 7,452,121 B2 | 11/2008 | Cho et al. |

(56) References Cited

U.S. PATENT DOCUMENTS

| | | |
|---|---|---|
| 7,457,113 B2 | 11/2008 | Kumhyr et al. |
| 7,466,546 B2 | 12/2008 | Park |
| 7,480,140 B2 | 1/2009 | Hara et al. |
| 7,492,589 B2 | 2/2009 | Park |
| 7,513,830 B2 | 4/2009 | Hajder et al. |
| 7,518,864 B2 | 4/2009 | Kimura |
| 7,525,633 B2 | 4/2009 | Tannas, Jr. |
| 7,535,543 B2 | 5/2009 | Dewa et al. |
| 7,535,547 B2 | 5/2009 | Tannas, Jr. |
| D595,678 S | 7/2009 | Dunn |
| 7,589,958 B2 | 9/2009 | Smith |
| 7,591,508 B2 | 9/2009 | Chang |
| 7,601,067 B2 | 10/2009 | Anderson |
| 7,602,469 B2 | 10/2009 | Shin |
| 7,609,506 B2 | 10/2009 | Aguirre |
| D608,775 S | 1/2010 | Leung |
| 7,667,964 B2 | 2/2010 | Kang et al. |
| 7,682,047 B2 | 3/2010 | Hsu et al. |
| 7,708,233 B2 | 5/2010 | Tannas, Jr. |
| 7,752,858 B2 | 7/2010 | Johnson et al. |
| 7,753,567 B2 | 7/2010 | Kang et al. |
| 7,762,707 B2 | 7/2010 | Kim et al. |
| 7,768,775 B2 | 8/2010 | Kim |
| 7,780,492 B2 | 8/2010 | Tannas, Jr. |
| 7,800,706 B2 | 9/2010 | Kim et al. |
| 7,813,124 B2 | 10/2010 | Karppanen |
| 7,815,552 B2 | 10/2010 | Dibble et al. |
| 7,903,416 B2 | 3/2011 | Chou |
| D635,614 S | 4/2011 | Yan |
| 7,938,051 B2 | 5/2011 | Tannas |
| 7,965,039 B2 | 6/2011 | Watanabe et al. |
| 7,985,139 B2 | 7/2011 | Lind et al. |
| 7,995,342 B2 | 8/2011 | Nakamichi et al. |
| 8,004,648 B2 | 8/2011 | Dunn |
| 8,006,435 B2 | 8/2011 | DeBlonk et al. |
| 8,016,452 B2 | 9/2011 | Dunn |
| 8,035,968 B2 | 10/2011 | Kwon et al. |
| 8,057,368 B1 | 11/2011 | Lyszczarz |
| 8,081,267 B2 | 12/2011 | Moscovitch et al. |
| 8,081,465 B2 | 12/2011 | Nishiura |
| 8,102,173 B2 | 1/2012 | Merrow |
| 8,102,483 B2 | 1/2012 | Perry et al. |
| 8,116,081 B2 | 2/2012 | Crick, Jr. |
| 8,142,027 B2 | 3/2012 | Sakai |
| D657,421 S | 4/2012 | Yan |
| D657,422 S | 4/2012 | Yan |
| 8,208,115 B2 | 6/2012 | Dunn |
| 8,223,311 B2 | 7/2012 | Kim et al. |
| 8,241,573 B2 | 8/2012 | Banerjee et al. |
| 8,248,784 B2 | 8/2012 | Nakamichi et al. |
| 8,254,121 B2 | 8/2012 | Lee et al. |
| 8,269,916 B2 | 9/2012 | Ohkawa |
| 8,270,163 B2 | 9/2012 | Nakamichi et al. |
| 8,274,622 B2 | 9/2012 | Dunn |
| 8,274,789 B2 | 9/2012 | Nakamichi et al. |
| D669,938 S | 10/2012 | Lard et al. |
| 8,300,203 B2 | 10/2012 | Nakamichi et al. |
| 8,310,824 B2 | 11/2012 | Dunn et al. |
| 8,320,119 B2 | 11/2012 | Isoshima et al. |
| 8,335,089 B2 | 12/2012 | Takahashi et al. |
| 8,351,014 B2 | 1/2013 | Dunn |
| 8,358,397 B2 | 1/2013 | Dunn |
| 8,369,083 B2 | 2/2013 | Dunn et al. |
| 8,373,841 B2 | 2/2013 | Dunn |
| 8,379,182 B2 | 2/2013 | Dunn |
| 8,400,608 B2 | 3/2013 | Takahashi et al. |
| 8,418,387 B2 | 4/2013 | Swatt et al. |
| 8,472,174 B2 | 6/2013 | Idems et al. |
| 8,472,191 B2 | 6/2013 | Yamamoto et al. |
| 8,482,695 B2 | 7/2013 | Dunn |
| 8,497,972 B2 | 7/2013 | Dunn et al. |
| 8,537,302 B2 | 9/2013 | Dunn |
| 8,590,602 B2 | 11/2013 | Fernandez |
| 8,649,170 B2 | 2/2014 | Dunn et al. |
| 8,649,176 B2 | 2/2014 | Okada et al. |
| 8,654,302 B2 | 2/2014 | Dunn et al. |
| 8,678,603 B2 | 3/2014 | Zhang |
| 8,693,185 B2 | 4/2014 | Dunn et al. |
| 8,700,226 B2 | 4/2014 | Schuch et al. |
| 8,711,321 B2 | 4/2014 | Dunn et al. |
| D704,265 S | 5/2014 | Yan |
| 8,749,749 B2 | 6/2014 | Hubbard |
| 8,755,021 B2 | 6/2014 | Hubbard |
| 8,758,144 B2 | 6/2014 | Williams et al. |
| 8,760,613 B2 | 6/2014 | Dunn |
| 8,767,165 B2 | 7/2014 | Dunn |
| 8,773,633 B2 | 7/2014 | Dunn et al. |
| 8,804,091 B2 | 8/2014 | Dunn et al. |
| 8,823,916 B2 | 9/2014 | Hubbard et al. |
| 8,827,472 B2 | 9/2014 | Takada |
| 8,854,572 B2 | 10/2014 | Dunn |
| 8,854,595 B2 | 10/2014 | Dunn |
| 8,879,042 B2 | 11/2014 | Dunn |
| 8,919,778 B2 | 12/2014 | Fodera |
| 8,976,313 B2 | 3/2015 | Kim et al. |
| 8,988,647 B2 | 3/2015 | Hubbard |
| 9,030,641 B2 | 5/2015 | Dunn |
| 9,061,597 B2 | 6/2015 | Oda et al. |
| 9,089,079 B2 | 7/2015 | Dunn |
| 9,119,325 B2 | 8/2015 | Dunn et al. |
| 9,119,330 B2 | 8/2015 | Hubbard et al. |
| 9,173,322 B2 | 10/2015 | Dunn |
| 9,173,325 B2 | 10/2015 | Dunn |
| 9,235,232 B2 | 1/2016 | King |
| 9,282,676 B1 | 3/2016 | Diaz |
| 9,285,108 B2 | 3/2016 | Dunn et al. |
| 9,313,447 B2 | 4/2016 | Dunn et al. |
| 9,313,917 B2 | 4/2016 | Dunn et al. |
| 9,317,060 B2 | 4/2016 | Dunn et al. |
| 9,335,579 B2 | 5/2016 | Onoue |
| 9,338,923 B2 | 5/2016 | Lee et al. |
| 9,357,673 B2 | 5/2016 | Chin |
| 9,370,127 B2 | 6/2016 | Dunn |
| 9,414,516 B2 | 8/2016 | Chin et al. |
| 9,448,569 B2 | 9/2016 | Schuch et al. |
| 9,451,060 B1 | 9/2016 | Bowers et al. |
| 9,451,733 B2 | 9/2016 | Dunn et al. |
| 9,456,525 B2 | 9/2016 | Yoon et al. |
| 9,470,924 B2 | 10/2016 | Dunn et al. |
| 9,500,896 B2 | 11/2016 | Dunn et al. |
| 9,504,188 B1 | 11/2016 | Campbell et al. |
| 9,516,485 B1 | 12/2016 | Bowers et al. |
| 9,549,490 B2 | 1/2017 | Hubbard |
| 9,594,271 B2 | 3/2017 | Dunn et al. |
| 9,600,026 B2 | 3/2017 | Birgeoglu et al. |
| 9,613,548 B2 | 4/2017 | DeMars |
| 9,622,392 B1 | 4/2017 | Bowers et al. |
| 9,629,287 B2 | 4/2017 | Dunn |
| 9,648,790 B2 | 5/2017 | Dunn et al. |
| 9,655,289 B2 | 5/2017 | Dunn et al. |
| 9,703,230 B2 | 7/2017 | Bowers et al. |
| 9,703,320 B2 | 7/2017 | Bowers et al. |
| 9,723,765 B2 | 8/2017 | DeMars |
| 9,743,553 B2 | 8/2017 | Kim et al. |
| 9,756,739 B2 | 9/2017 | Russell-Clarke et al. |
| 9,797,588 B2 | 10/2017 | Dunn et al. |
| 9,801,305 B2 | 10/2017 | Dunn et al. |
| 9,823,690 B2 | 11/2017 | Bowers et al. |
| 9,835,893 B2 | 12/2017 | Dunn |
| 9,857,618 B2 | 1/2018 | Barnes |
| 9,861,007 B2 | 1/2018 | Yoon et al. |
| 9,894,800 B2 | 2/2018 | Dunn |
| 9,943,017 B2 | 4/2018 | Bouissiere et al. |
| 10,070,540 B2 | 9/2018 | Campagna et al. |
| 10,080,316 B2 | 9/2018 | Dunn et al. |
| 10,088,702 B2 | 10/2018 | Dunn et al. |
| 10,120,419 B2 | 11/2018 | Tatsuta |
| 10,143,106 B2 | 11/2018 | Diaz |
| 10,165,712 B1 | 12/2018 | Jang et al. |
| 10,180,591 B2 | 1/2019 | Lee et al. |
| 10,194,564 B2 | 1/2019 | Dunn et al. |
| 10,212,845 B2 | 2/2019 | Dunn et al. |
| 10,278,311 B2 | 4/2019 | DeMars |
| 10,278,312 B1 | 4/2019 | Davis et al. |

(56) References Cited

U.S. PATENT DOCUMENTS

| | | |
|---|---|---|
| 10,306,781 B2 | 5/2019 | Cho et al. |
| 10,314,212 B2 | 6/2019 | Hubbard |
| 10,359,659 B2 | 7/2019 | Dunn et al. |
| 10,359,817 B2 | 7/2019 | Yun et al. |
| 10,383,238 B2 | 8/2019 | Yun et al. |
| 10,398,058 B2 | 8/2019 | Diaz |
| 10,398,066 B2 | 8/2019 | Dunn et al. |
| 10,401,016 B2 | 9/2019 | Coo |
| 10,405,456 B2 | 9/2019 | Jang et al. |
| 10,409,323 B2 | 9/2019 | Birgeoglu et al. |
| 10,420,257 B2 | 9/2019 | Dunn et al. |
| 10,485,113 B2 | 11/2019 | Dunn et al. |
| 10,485,147 B2 | 11/2019 | Oh et al. |
| 10,485,148 B2 | 11/2019 | Oh et al. |
| 10,488,896 B2 | 11/2019 | Simpson |
| 10,499,516 B2 | 12/2019 | Dunn et al. |
| 10,506,738 B2 | 12/2019 | Dunn |
| 10,506,740 B2 | 12/2019 | Dunn et al. |
| 10,524,384 B2 | 12/2019 | Dunn et al. |
| 10,524,397 B2 | 12/2019 | Dunn et al. |
| 10,548,247 B2 | 1/2020 | Demars |
| 10,559,965 B2 | 2/2020 | Dunn et al. |
| 10,602,626 B2 | 3/2020 | Dunn |
| 10,624,218 B2 | 4/2020 | Dunn et al. |
| 10,660,245 B2 | 5/2020 | Dunn et al. |
| 10,687,446 B2 | 6/2020 | Dunn et al. |
| 10,716,224 B2 | 7/2020 | Dunn et al. |
| 10,721,836 B2 | 7/2020 | Dunn et al. |
| 10,736,245 B2 | 8/2020 | Dunn et al. |
| 10,747,261 B2 | 8/2020 | Birgeoglu et al. |
| 10,754,184 B2 | 8/2020 | Wang et al. |
| 10,757,844 B2 | 8/2020 | Dunn et al. |
| 10,795,413 B1 | 10/2020 | Dunn |
| 10,820,445 B2 | 10/2020 | Diaz |
| 10,827,644 B2 | 11/2020 | Diaz |
| 10,827,656 B2 | 11/2020 | Hubbard |
| 10,827,657 B2 | 11/2020 | Lee |
| 10,844,995 B1 | 11/2020 | Wang et al. |
| 10,905,035 B2 | 1/2021 | Whitehead et al. |
| 10,925,174 B2 | 2/2021 | Dunn et al. |
| 10,969,615 B2 | 4/2021 | Wang et al. |
| 10,973,156 B2 | 4/2021 | Dunn et al. |
| 10,999,941 B2 | 5/2021 | Dunn |
| 11,013,142 B2 | 5/2021 | Dunn et al. |
| 11,016,547 B2 | 5/2021 | Whitehead et al. |
| 11,019,735 B2 | 5/2021 | Dunn |
| 11,032,923 B2 | 6/2021 | Dunn et al. |
| 11,096,317 B2 | 8/2021 | Dunn |
| 11,117,482 B2 | 9/2021 | Mercer et al. |
| 11,191,193 B2 | 11/2021 | Hubbard |
| 11,336,101 B2 | 5/2022 | Hao et al. |
| 11,338,168 B2 | 5/2022 | Yang |
| 11,778,757 B2 | 10/2023 | Dunn et al. |
| 11,822,171 B2 | 11/2023 | Dunn et al. |
| 11,919,393 B2 | 3/2024 | Dunn et al. |
| 11,934,054 B2 | 3/2024 | Dunn et al. |
| 11,997,808 B2 | 5/2024 | Dunn et al. |
| D1,029,778 S | 6/2024 | Dunn et al. |
| D1,029,939 S | 6/2024 | Dunn et al. |
| D1,029,940 S | 6/2024 | Dunn et al. |
| D1,030,691 S | 6/2024 | Dunn et al. |
| D1,030,873 S | 6/2024 | Dunn et al. |
| D1,030,888 S | 6/2024 | Dunn et al. |
| 12,004,310 B2 | 6/2024 | Dunn et al. |
| 12,022,624 B2 | 6/2024 | Dunn et al. |
| 12,039,894 B2 | 7/2024 | Dunn et al. |
| 12,072,561 B2 | 8/2024 | Dunn et al. |
| 2001/0001459 A1 | 5/2001 | Savant et al. |
| 2001/0019454 A1 | 9/2001 | Tadic-Galeb et al. |
| 2001/0023914 A1 | 9/2001 | Oddsen, Jr. |
| 2001/0032404 A1 | 10/2001 | Hillstrom |
| 2001/0043290 A1 | 11/2001 | Yamamoto |
| 2001/0043293 A1 | 11/2001 | Inoue |
| 2002/0009978 A1 | 1/2002 | Dukach et al. |
| 2002/0033919 A1 | 3/2002 | Sanelle et al. |
| 2002/0050793 A1 | 5/2002 | Cull et al. |
| 2002/0065046 A1 | 5/2002 | Mankins et al. |
| 2002/0077229 A1 | 6/2002 | McBride |
| 2002/0084891 A1 | 7/2002 | Mankins et al. |
| 2002/0101553 A1 | 8/2002 | Enomoto et al. |
| 2002/0112026 A1 | 8/2002 | Fridman et al. |
| 2002/0126248 A1 | 9/2002 | Yoshida |
| 2002/0148600 A1 | 10/2002 | Bosch et al. |
| 2002/0149714 A1 | 10/2002 | Anderson et al. |
| 2002/0154255 A1 | 10/2002 | Gromatzky et al. |
| 2002/0164944 A1 | 11/2002 | Haglid |
| 2002/0164962 A1 | 11/2002 | Mankins et al. |
| 2002/0167637 A1 | 11/2002 | Burke et al. |
| 2003/0007109 A1 | 1/2003 | Park |
| 2003/0020884 A1 | 1/2003 | Okada et al. |
| 2003/0039094 A1 | 2/2003 | Sarkinen et al. |
| 2003/0043091 A1 | 3/2003 | Takeuchi et al. |
| 2003/0104210 A1 | 6/2003 | Azumi et al. |
| 2003/0128511 A1 | 7/2003 | Nagashima et al. |
| 2003/0214785 A1 | 11/2003 | Perazzo |
| 2004/0012722 A1 | 1/2004 | Alvarez |
| 2004/0025389 A1 | 2/2004 | Peterson |
| 2004/0035032 A1 | 2/2004 | Milliken |
| 2004/0035558 A1 | 2/2004 | Todd et al. |
| 2004/0036622 A1 | 2/2004 | Dukach et al. |
| 2004/0036834 A1 | 2/2004 | Ohnishi et al. |
| 2004/0042174 A1 | 3/2004 | Tomioka et al. |
| 2004/0103570 A1 | 6/2004 | Ruttenberg |
| 2004/0105159 A1 | 6/2004 | Saccomanno et al. |
| 2004/0135482 A1 | 7/2004 | Thielemans et al. |
| 2004/0165139 A1 | 8/2004 | Anderson et al. |
| 2004/0207981 A1 | 10/2004 | Gorenz, Jr. et al. |
| 2004/0212548 A1 | 10/2004 | Ruttenberg |
| 2004/0223299 A1 | 11/2004 | Ghosh |
| 2004/0257492 A1 | 12/2004 | Mai et al. |
| 2005/0012039 A1 | 1/2005 | Faytlin et al. |
| 2005/0012722 A1 | 1/2005 | Chon |
| 2005/0062373 A1 | 3/2005 | Kim et al. |
| 2005/0073632 A1 | 4/2005 | Dunn et al. |
| 2005/0073639 A1 | 4/2005 | Pan |
| 2005/0105178 A1 | 5/2005 | Kim |
| 2005/0127796 A1 | 6/2005 | Olesen et al. |
| 2005/0134525 A1 | 6/2005 | Tanghe et al. |
| 2005/0134526 A1 | 6/2005 | Willem et al. |
| 2005/0213950 A1 | 9/2005 | Yoshimura |
| 2005/0219841 A1 | 10/2005 | Ikeda et al. |
| 2005/0229630 A1 | 10/2005 | Richter et al. |
| 2005/0237714 A1 | 10/2005 | Ebermann |
| 2005/0253699 A1 | 11/2005 | Madonia |
| 2005/0276053 A1 | 12/2005 | Nortrup et al. |
| 2005/0286131 A1 | 12/2005 | Saxena et al. |
| 2006/0012958 A1 | 1/2006 | Tomioka et al. |
| 2006/0012985 A1 | 1/2006 | Archie, Jr. et al. |
| 2006/0018093 A1 | 1/2006 | Lai et al. |
| 2006/0034051 A1 | 2/2006 | Wang et al. |
| 2006/0056994 A1 | 3/2006 | Van Lear et al. |
| 2006/0060732 A1 | 3/2006 | Tannas, Jr. |
| 2006/0077636 A1 | 4/2006 | Kim |
| 2006/0081367 A1 | 4/2006 | Chiu et al. |
| 2006/0082271 A1 | 4/2006 | Lee et al. |
| 2006/0092348 A1 | 5/2006 | Park |
| 2006/0125998 A1 | 6/2006 | Dewa et al. |
| 2006/0132699 A1 | 6/2006 | Cho et al. |
| 2006/0137294 A1 | 6/2006 | Waits et al. |
| 2006/0144987 A1 | 7/2006 | Clark |
| 2006/0177587 A1 | 8/2006 | Ishizuka et al. |
| 2006/0199514 A1 | 9/2006 | Kimura |
| 2006/0209266 A1 | 9/2006 | Utsunomiya |
| 2006/0215421 A1 | 9/2006 | Chang et al. |
| 2006/0218828 A1 | 10/2006 | Schrimpf et al. |
| 2006/0260790 A1 | 11/2006 | Theno et al. |
| 2006/0262079 A1 | 11/2006 | Seong et al. |
| 2006/0266499 A1 | 11/2006 | Choi et al. |
| 2006/0268194 A1 | 11/2006 | Morimoto et al. |
| 2006/0269216 A1 | 11/2006 | Wiemeyer et al. |
| 2006/0283579 A1 | 12/2006 | Ghosh et al. |
| 2007/0013647 A1 | 1/2007 | Lee et al. |
| 2007/0019419 A1 | 1/2007 | Hafuka et al. |
| 2007/0021217 A1 | 1/2007 | Wu |

(56) References Cited

U.S. PATENT DOCUMENTS

| | | |
|---|---|---|
| 2007/0030879 A1 | 2/2007 | Hatta |
| 2007/0046874 A1 | 3/2007 | Adachi et al. |
| 2007/0047239 A1 | 3/2007 | Kang et al. |
| 2007/0065091 A1 | 3/2007 | Hinata et al. |
| 2007/0070615 A1 | 3/2007 | Joslin et al. |
| 2007/0076431 A1 | 4/2007 | Atarashi et al. |
| 2007/0081344 A1 | 4/2007 | Cappaert et al. |
| 2007/0103863 A1 | 5/2007 | Kim |
| 2007/0103866 A1 | 5/2007 | Park |
| 2007/0115686 A1 | 5/2007 | Tyberghien |
| 2007/0135272 A1 | 6/2007 | Stuckey |
| 2007/0139574 A1 | 6/2007 | Ko et al. |
| 2007/0139929 A1 | 6/2007 | Yoo et al. |
| 2007/0140671 A1 | 6/2007 | Yoshimura |
| 2007/0144704 A1 | 6/2007 | Bundza et al. |
| 2007/0151274 A1 | 7/2007 | Roche et al. |
| 2007/0151664 A1 | 7/2007 | Shin |
| 2007/0159035 A1 | 7/2007 | Mullen |
| 2007/0171353 A1 | 7/2007 | Hong |
| 2007/0176885 A1 | 8/2007 | Jun |
| 2007/0206158 A1 | 9/2007 | Kinoshita et al. |
| 2007/0211205 A1 | 9/2007 | Shibata |
| 2007/0212211 A1 | 9/2007 | Chiyoda et al. |
| 2007/0217221 A1 | 9/2007 | Lee et al. |
| 2007/0237636 A1 | 10/2007 | Hsu |
| 2007/0253205 A1 | 11/2007 | Welker |
| 2007/0267174 A1 | 11/2007 | Kim |
| 2007/0267554 A1 | 11/2007 | Tannas, Jr. |
| 2007/0270293 A1 | 11/2007 | Zhuang |
| 2008/0002350 A1 | 1/2008 | Farrugia |
| 2008/0035315 A1 | 2/2008 | Han |
| 2008/0054144 A1 | 3/2008 | Wohlford |
| 2008/0055534 A1 | 3/2008 | Kawano |
| 2008/0076342 A1 | 3/2008 | Bryant et al. |
| 2008/0099193 A1 | 5/2008 | Aksamit et al. |
| 2008/0100186 A1 | 5/2008 | Li |
| 2008/0148609 A1 | 6/2008 | Ogoreve |
| 2008/0165496 A1 | 7/2008 | Kang et al. |
| 2008/0174456 A1 | 7/2008 | Warren |
| 2008/0209934 A1 | 9/2008 | Richards |
| 2008/0218446 A1 | 9/2008 | Yamanaka |
| 2008/0236005 A1 | 10/2008 | Isayev et al. |
| 2008/0255901 A1 | 10/2008 | Carroll et al. |
| 2008/0267790 A1 | 10/2008 | Gaudet et al. |
| 2008/0276507 A1 | 11/2008 | Hines |
| 2008/0283234 A1 | 11/2008 | Sagi et al. |
| 2008/0285290 A1 | 11/2008 | Ohashi et al. |
| 2008/0296134 A1 | 12/2008 | Hattori et al. |
| 2008/0304219 A1 | 12/2008 | Chen |
| 2008/0310116 A1 | 12/2008 | O'Connor |
| 2008/0310158 A1 | 12/2008 | Harbers et al. |
| 2009/0009041 A1 | 1/2009 | Zeidler |
| 2009/0009047 A1 | 1/2009 | Yanagawa et al. |
| 2009/0009729 A1 | 1/2009 | Sakai |
| 2009/0016004 A1 | 1/2009 | McCoy |
| 2009/0021461 A1 | 1/2009 | Hu et al. |
| 2009/0034188 A1 | 2/2009 | Sween et al. |
| 2009/0059518 A1 | 3/2009 | Kakikawa et al. |
| 2009/0065007 A1 | 3/2009 | Wilkinson et al. |
| 2009/0086430 A1 | 4/2009 | Kang et al. |
| 2009/0095819 A1 | 4/2009 | Brown et al. |
| 2009/0104989 A1 | 4/2009 | Williams et al. |
| 2009/0120629 A1 | 5/2009 | Ashe |
| 2009/0122218 A1 | 5/2009 | Oh et al. |
| 2009/0126906 A1 | 5/2009 | Dunn |
| 2009/0126907 A1 | 5/2009 | Dunn |
| 2009/0126914 A1 | 5/2009 | Dunn |
| 2009/0129021 A1 | 5/2009 | Dunn |
| 2009/0135365 A1 | 5/2009 | Dunn |
| 2009/0141199 A1 | 6/2009 | Fujikawa |
| 2009/0147170 A1 | 6/2009 | Oh et al. |
| 2009/0154096 A1 | 6/2009 | Iyengar et al. |
| 2009/0174626 A1 | 7/2009 | Isoshima et al. |
| 2009/0227167 A1 | 9/2009 | Tannas, Jr. |
| 2009/0231807 A1 | 9/2009 | Bouissiere |
| 2009/0241388 A1 | 10/2009 | Dunn |
| 2009/0241437 A1 | 10/2009 | Steinle et al. |
| 2009/0244472 A1 | 10/2009 | Dunn |
| 2009/0266507 A1 | 10/2009 | Turnbull et al. |
| 2009/0278007 A1 | 11/2009 | Taylor |
| 2009/0279240 A1 | 11/2009 | Karppanen |
| 2009/0302727 A1 | 12/2009 | Vincent et al. |
| 2009/0306820 A1 | 12/2009 | Simmons et al. |
| 2009/0323275 A1 | 12/2009 | Rehmann et al. |
| 2010/0060861 A1 | 3/2010 | Medin |
| 2010/0079949 A1 | 4/2010 | Nakamichi et al. |
| 2010/0079979 A1 | 4/2010 | Nakamichi et al. |
| 2010/0162747 A1 | 7/2010 | Hamel et al. |
| 2010/0171889 A1 | 7/2010 | Pantel et al. |
| 2010/0182562 A1 | 7/2010 | Yoshida et al. |
| 2010/0213323 A1 | 8/2010 | Tannas, Jr. |
| 2010/0220249 A1 | 9/2010 | Nakamichi et al. |
| 2010/0226091 A1 | 9/2010 | Dunn |
| 2010/0232107 A1 | 9/2010 | Dunn |
| 2010/0238394 A1 | 9/2010 | Dunn |
| 2010/0297907 A1 | 11/2010 | Tannas, Jr. |
| 2010/0321887 A1 | 12/2010 | Kwon et al. |
| 2011/0001898 A1 | 1/2011 | Mikubo et al. |
| 2011/0013114 A1 | 1/2011 | Dunn et al. |
| 2011/0019348 A1 | 1/2011 | Kludt et al. |
| 2011/0019363 A1 | 1/2011 | Vahlsing et al. |
| 2011/0032489 A1 | 2/2011 | Kimoto et al. |
| 2011/0051071 A1 | 3/2011 | Nakamichi et al. |
| 2011/0051369 A1 | 3/2011 | Takahara |
| 2011/0058326 A1 | 3/2011 | Idems et al. |
| 2011/0072697 A1 | 3/2011 | Miller |
| 2011/0075361 A1 | 3/2011 | Nakamichi et al. |
| 2011/0083460 A1 | 4/2011 | Thomas et al. |
| 2011/0083824 A1 | 4/2011 | Rogers |
| 2011/0085301 A1 | 4/2011 | Dunn |
| 2011/0085302 A1 | 4/2011 | Nakamichi et al. |
| 2011/0090630 A1 | 4/2011 | Bergeron et al. |
| 2011/0114384 A1 | 5/2011 | Sakamoto et al. |
| 2011/0116000 A1 | 5/2011 | Dunn et al. |
| 2011/0116231 A1 | 5/2011 | Dunn et al. |
| 2011/0122162 A1 | 5/2011 | Sato et al. |
| 2011/0134356 A1 | 6/2011 | Swatt et al. |
| 2011/0141672 A1 | 6/2011 | Farley, Jr. et al. |
| 2011/0141724 A1 | 6/2011 | Erion |
| 2011/0162831 A1 | 7/2011 | Lee et al. |
| 2011/0167845 A1 | 7/2011 | Lee et al. |
| 2011/0227467 A1 | 9/2011 | Foppe, Jr. et al. |
| 2011/0261523 A1 | 10/2011 | Dunn et al. |
| 2011/0297810 A1 | 12/2011 | Tachibana |
| 2012/0006523 A1 | 1/2012 | Masahiro et al. |
| 2012/0012295 A1 | 1/2012 | Kakiuchi et al. |
| 2012/0012300 A1 | 1/2012 | Dunn et al. |
| 2012/0014063 A1 | 1/2012 | Weiss |
| 2012/0020114 A1 | 1/2012 | Miyamoto et al. |
| 2012/0038849 A1 | 2/2012 | Dunn et al. |
| 2012/0044217 A1 | 2/2012 | Okada et al. |
| 2012/0050958 A1 | 3/2012 | Sanford et al. |
| 2012/0105424 A1 | 5/2012 | Lee et al. |
| 2012/0105790 A1 | 5/2012 | Hubbard |
| 2012/0106081 A1 | 5/2012 | Hubbard et al. |
| 2012/0131936 A1 | 5/2012 | Yoshida et al. |
| 2012/0162878 A1 | 6/2012 | Fukuma et al. |
| 2012/0188481 A1 | 7/2012 | Kang et al. |
| 2012/0206687 A1 | 8/2012 | Dunn et al. |
| 2012/0223877 A1 | 9/2012 | Cho |
| 2012/0224116 A1 | 9/2012 | Barnes |
| 2012/0236499 A1 | 9/2012 | Murayama et al. |
| 2012/0249402 A1 | 10/2012 | Kang |
| 2012/0253672 A1 | 10/2012 | Hoshino et al. |
| 2012/0255704 A1 | 10/2012 | Nakamichi |
| 2012/0268686 A1* | 10/2012 | Lee .................. G02F 1/133308 349/59 |
| 2012/0274876 A1 | 11/2012 | Cappaert et al. |
| 2012/0284547 A1 | 11/2012 | Culbert et al. |
| 2012/0327600 A1 | 12/2012 | Dunn |
| 2013/0069588 A1 | 3/2013 | Oda et al. |
| 2013/0170140 A1 | 7/2013 | Dunn |
| 2013/0173358 A1 | 7/2013 | Pinkus |
| 2013/0176517 A1 | 7/2013 | Kim et al. |

(56) References Cited

U.S. PATENT DOCUMENTS

| | | |
|---|---|---|
| 2013/0201685 A1 | 8/2013 | Messmore et al. |
| 2013/0211583 A1 | 8/2013 | Borra |
| 2013/0258659 A1 | 10/2013 | Erion |
| 2013/0270975 A1 | 10/2013 | Dunn et al. |
| 2013/0279154 A1 | 10/2013 | Dunn |
| 2013/0294039 A1 | 11/2013 | Chao |
| 2013/0300360 A1 | 11/2013 | Kobayashi et al. |
| 2013/0329363 A1 | 12/2013 | Dunn et al. |
| 2013/0344794 A1 | 12/2013 | Shaw et al. |
| 2014/0044147 A1 | 2/2014 | Wyatt et al. |
| 2014/0055914 A1 | 2/2014 | Fournier |
| 2014/0085564 A1 | 3/2014 | Hendren et al. |
| 2014/0111758 A1 | 4/2014 | Dunn et al. |
| 2014/0113540 A1 | 4/2014 | Dunn et al. |
| 2014/0134767 A1 | 5/2014 | Ishida et al. |
| 2014/0184980 A1 | 7/2014 | Onoue |
| 2014/0190240 A1 | 7/2014 | He et al. |
| 2014/0208626 A1 | 7/2014 | Moon |
| 2014/0268657 A1 | 9/2014 | Dunn et al. |
| 2014/0313452 A1 | 10/2014 | Dunn et al. |
| 2014/0313666 A1 | 10/2014 | Chin |
| 2014/0313698 A1 | 10/2014 | Dunn et al. |
| 2014/0314395 A1 | 10/2014 | Dunn et al. |
| 2014/0334100 A1 | 11/2014 | Yoon et al. |
| 2014/0361138 A1 | 12/2014 | Ramirez et al. |
| 2015/0009625 A1 | 1/2015 | Chin et al. |
| 2015/0009627 A1 | 1/2015 | Dunn et al. |
| 2015/0066837 A1 | 3/2015 | Twarog et al. |
| 2015/0069832 A1 | 3/2015 | Yamane et al. |
| 2015/0087404 A1 | 3/2015 | Lesley et al. |
| 2015/0192371 A1 | 7/2015 | Hancock |
| 2015/0211676 A1 | 7/2015 | Martin et al. |
| 2015/0253611 A1 | 9/2015 | Yang et al. |
| 2015/0264826 A1 | 9/2015 | Dunn et al. |
| 2015/0319882 A1 | 11/2015 | Dunn et al. |
| 2015/0366101 A1 | 12/2015 | Dunn et al. |
| 2016/0014910 A1 | 1/2016 | Campagna et al. |
| 2016/0041423 A1 | 2/2016 | Dunn |
| 2016/0044829 A1 | 2/2016 | Dunn |
| 2016/0121735 A1 | 5/2016 | Sugano |
| 2016/0162297 A1 | 6/2016 | Shao |
| 2016/0192536 A1 | 6/2016 | Diaz |
| 2016/0195254 A1 | 7/2016 | Dunn et al. |
| 2016/0198588 A1 | 7/2016 | DeMars |
| 2016/0238876 A1 | 8/2016 | Dunn et al. |
| 2016/0242329 A1 | 8/2016 | DeMars |
| 2016/0242330 A1 | 8/2016 | Dunn |
| 2016/0249493 A1 | 8/2016 | Dunn et al. |
| 2016/0265759 A1 | 9/2016 | Na et al. |
| 2016/0302331 A1 | 10/2016 | Dunn |
| 2017/0023823 A1 | 1/2017 | Dunn et al. |
| 2017/0040789 A1 | 2/2017 | Bonilla et al. |
| 2017/0068042 A1 | 3/2017 | Dunn et al. |
| 2017/0074453 A1 | 3/2017 | Bowers et al. |
| 2017/0083043 A1 | 3/2017 | Bowers et al. |
| 2017/0083062 A1 | 3/2017 | Bowers et al. |
| 2017/0111486 A1 | 4/2017 | Bowers et al. |
| 2017/0111520 A1 | 4/2017 | Bowers et al. |
| 2017/0111521 A1 | 4/2017 | Bowers et al. |
| 2017/0127579 A1 | 5/2017 | Hubbard |
| 2017/0140344 A1 | 5/2017 | Bowers et al. |
| 2017/0147992 A1 | 5/2017 | Bowers et al. |
| 2017/0163519 A1 | 6/2017 | Bowers et al. |
| 2017/0172016 A1 | 6/2017 | Kang |
| 2017/0175411 A1 | 6/2017 | Bowers et al. |
| 2017/0188490 A1 | 6/2017 | Dunn et al. |
| 2017/0231112 A1 | 8/2017 | Dunn et al. |
| 2017/0245400 A1 | 8/2017 | Dunn et al. |
| 2017/0257978 A1 | 9/2017 | Diaz |
| 2017/0318921 A1 | 11/2017 | Gharabegian |
| 2017/0332523 A1 | 11/2017 | DeMars |
| 2017/0345346 A1 | 11/2017 | Hong et al. |
| 2018/0020579 A1 | 1/2018 | Chang et al. |
| 2018/0042134 A1 | 2/2018 | Dunn et al. |
| 2018/0088368 A1 | 3/2018 | Notoshi et al. |
| 2018/0088398 A1 | 3/2018 | Lee et al. |
| 2018/0111495 A1 | 4/2018 | Kinomura |
| 2018/0116073 A1 | 4/2018 | Dunn |
| 2018/0199450 A1 | 7/2018 | Kim et al. |
| 2018/0210492 A1 | 7/2018 | Chen et al. |
| 2018/0259806 A1 | 9/2018 | Oh et al. |
| 2018/0263142 A1 | 9/2018 | Oh et al. |
| 2018/0272959 A1 | 9/2018 | Hornsby et al. |
| 2018/0314103 A1 | 11/2018 | Dunn et al. |
| 2018/0315356 A1 | 11/2018 | Dunn et al. |
| 2018/0317330 A1 | 11/2018 | Dunn et al. |
| 2018/0317350 A1 | 11/2018 | Dunn et al. |
| 2018/0345809 A1 | 12/2018 | Derrien et al. |
| 2018/0364519 A1 | 12/2018 | Dunn et al. |
| 2019/0021189 A1 | 1/2019 | Kim et al. |
| 2019/0037738 A1 | 1/2019 | Dunn et al. |
| 2019/0056058 A1 | 2/2019 | Pell et al. |
| 2019/0059175 A1 | 2/2019 | Diaz |
| 2019/0089176 A1 | 3/2019 | Dunn et al. |
| 2019/0133002 A1 | 5/2019 | Dunn et al. |
| 2019/0147492 A1 | 5/2019 | Krylov |
| 2019/0159363 A1 | 5/2019 | Jang et al. |
| 2019/0196251 A1* | 6/2019 | Woo ................. G02F 1/133308 |
| 2019/0208674 A1 | 7/2019 | Demars |
| 2019/0239365 A1 | 8/2019 | Dunn et al. |
| 2019/0250651 A1 | 8/2019 | Liu et al. |
| 2019/0289754 A1 | 9/2019 | Hubbard |
| 2019/0302854 A1 | 10/2019 | Wu et al. |
| 2019/0327865 A1 | 10/2019 | Dunn et al. |
| 2019/0335613 A1 | 10/2019 | Diaz |
| 2020/0037456 A1 | 1/2020 | Dunn |
| 2020/0150597 A1 | 5/2020 | Aghara et al. |
| 2020/0154597 A1 | 5/2020 | Dunn et al. |
| 2020/0163234 A1 | 5/2020 | Dunn |
| 2020/0163235 A1 | 5/2020 | Dunn |
| 2020/0201402 A1 | 6/2020 | Lee et al. |
| 2020/0205303 A1 | 6/2020 | Dunn et al. |
| 2020/0241612 A1 | 7/2020 | Moon et al. |
| 2020/0253095 A1 | 8/2020 | Dunn et al. |
| 2020/0275585 A1 | 8/2020 | Dunn |
| 2020/0288585 A1 | 9/2020 | Dunn et al. |
| 2020/0319676 A1 | 10/2020 | Dunn |
| 2020/0352049 A1 | 11/2020 | Dunn et al. |
| 2020/0366104 A1 | 11/2020 | Stanfield |
| 2020/0367391 A1 | 11/2020 | Dunn |
| 2020/0369169 A1 | 11/2020 | Mercer et al. |
| 2020/0383246 A1 | 12/2020 | Lee |
| 2020/0387194 A1 | 12/2020 | Dunn |
| 2020/0390004 A1 | 12/2020 | Whitehead et al. |
| 2020/0390009 A1 | 12/2020 | Whitehead et al. |
| 2021/0007241 A1 | 1/2021 | Diaz |
| 2021/0022273 A1 | 1/2021 | Hubbard |
| 2021/0094437 A1 | 4/2021 | Tsubokura et al. |
| 2021/0165472 A1 | 6/2021 | Chin |
| 2021/0168949 A1 | 6/2021 | Dunn et al. |
| 2021/0182919 A1 | 6/2021 | Wyckoff et al. |
| 2021/0231998 A1 | 7/2021 | Noso et al. |
| 2021/0243906 A1 | 8/2021 | Dunn |
| 2021/0243914 A1 | 8/2021 | Dunn |
| 2021/0304644 A1 | 9/2021 | Webster |
| 2021/0307214 A1 | 9/2021 | Zhang et al. |
| 2021/0345528 A1 | 11/2021 | Dunn |
| 2021/0361997 A1 | 11/2021 | Yang |
| 2022/0035198 A1 | 2/2022 | Dunn et al. |
| 2022/0073021 A1 | 3/2022 | Dunn et al. |
| 2022/0110227 A1 | 4/2022 | Brown |
| 2022/0121255 A1 | 4/2022 | Wang et al. |
| 2022/0132681 A1 | 4/2022 | Dunn et al. |
| 2022/0132707 A1 | 4/2022 | Dunn et al. |
| 2022/0287200 A1 | 9/2022 | Dunn et al. |
| 2022/0295666 A1 | 9/2022 | Dunn et al. |
| 2022/0327968 A1 | 10/2022 | Wesley et al. |
| 2022/0379158 A1 | 12/2022 | Harwerth |
| 2022/0394861 A1 | 12/2022 | Dunn et al. |
| 2023/0058547 A1 | 2/2023 | Dunn et al. |
| 2023/0118879 A1 | 4/2023 | Yang |
| 2023/0124790 A1 | 4/2023 | Yang |
| 2023/0287670 A1 | 9/2023 | Ethier |
| 2023/0333423 A1 | 10/2023 | Dunn et al. |

(56) References Cited

U.S. PATENT DOCUMENTS

| | | | |
|---|---|---|---|
| 2023/0380079 | A1 | 11/2023 | Dunn et al. |
| 2024/0027806 | A1 | 1/2024 | Dunn et al. |
| 2024/0096246 | A1 | 3/2024 | Dunn et al. |
| 2024/0096247 | A1 | 3/2024 | Dunn et al. |
| 2024/0098919 | A1 | 3/2024 | Dunn et al. |
| 2024/0276662 | A1 | 8/2024 | Dunn et al. |

FOREIGN PATENT DOCUMENTS

| | | |
|---|---|---|
| AU | 2015253128 B2 | 3/2018 |
| AU | 2017216500 B2 | 10/2018 |
| AU | 2015229457 B2 | 3/2019 |
| AU | 2016220308 B2 | 3/2019 |
| AU | 2017228430 B2 | 3/2020 |
| AU | 2018258497 B2 | 1/2021 |
| AU | 2018257648 B2 | 2/2021 |
| AU | 2019315350 B2 | 9/2022 |
| AU | 2022202810 B2 | 11/2023 |
| BR | PI0820231-1 | 2/2019 |
| CA | 2705814 C | 2/2018 |
| CA | 2947524 C | 4/2018 |
| CA | 2915261 C | 8/2018 |
| CA | 2780884 C | 4/2019 |
| CA | 2798277 C | 6/2019 |
| CA | 2809019 C | 9/2019 |
| CA | 2888494 C | 9/2019 |
| CA | 2976116 C | 11/2020 |
| CA | 3015365 C | 8/2021 |
| CA | 3059972 C | 1/2022 |
| CA | 2942321 C | 6/2022 |
| CA | 3106866 C | 11/2023 |
| CA | 226764 | 11/2024 |
| CN | 2702363 Y | 5/2005 |
| CN | 201228893 Y | 4/2009 |
| CN | 202838830 U | 3/2013 |
| CN | 106304788 A | 1/2017 |
| CN | 107251671 A | 10/2017 |
| CN | 206610564 U | 11/2017 |
| CN | 108700739 A | 10/2018 |
| CN | 107251671 B | 8/2019 |
| CN | 214171740 U | 9/2021 |
| EM | 015031795-0001 | 8/2023 |
| EM | 015031795-0002 | 8/2023 |
| EM | 015031795-0003 | 8/2023 |
| EM | 015031795-0004 | 8/2023 |
| EM | 015031795-0005 | 8/2023 |
| EM | 015031795-0006 | 8/2023 |
| EM | 015044249-0001 | 12/2023 |
| EP | 1408476 A1 | 4/2004 |
| EP | 1647766 A2 | 4/2006 |
| EP | 1722559 A1 | 11/2006 |
| EP | 1762892 A1 | 3/2007 |
| EP | 1951020 A1 | 7/2008 |
| EP | 2225603 A2 | 9/2010 |
| EP | 2370987 A2 | 10/2011 |
| EP | 2603831 A2 | 6/2013 |
| EP | 2801888 A2 | 11/2014 |
| EP | 2909829 A1 | 8/2015 |
| EP | 3020260 A2 | 5/2016 |
| EP | 3040766 A1 | 7/2016 |
| EP | 3117693 A2 | 1/2017 |
| EP | 3259968 A1 | 12/2017 |
| EP | 3423886 A0 | 1/2019 |
| EP | 3468321 A1 | 4/2019 |
| EP | 3138372 B1 | 5/2019 |
| EP | 3117693 B1 | 8/2019 |
| EP | 2567283 B1 | 10/2019 |
| EP | 2909829 B1 | 2/2020 |
| EP | 3615978 A1 | 3/2020 |
| EP | 3616481 A1 | 3/2020 |
| EP | 3624574 A1 | 3/2020 |
| EP | 3468321 B1 | 4/2021 |
| EP | 3830464 A1 | 6/2021 |
| EP | 342886 B1 | 2/2022 |
| EP | 3423886 B1 | 2/2022 |
| EP | 3259968 B1 | 4/2022 |
| EP | 4232870 A1 | 8/2023 |
| GB | 153110 | 11/1920 |
| GB | 2402205 A | 12/2004 |
| GB | 2483703 A | 3/2012 |
| GB | 6304834 | 8/2023 |
| GB | 6304835 | 8/2023 |
| GB | 6304836 | 8/2023 |
| GB | 6304837 | 8/2023 |
| GB | 6304838 | 8/2023 |
| GB | 6304839 | 8/2023 |
| GB | 6333108 | 12/2023 |
| JP | 402062015 A | 3/1990 |
| JP | 402307080 A | 12/1990 |
| JP | 3153212 A | 7/1991 |
| JP | H06-2337 U | 1/1994 |
| JP | 6082745 A | 3/1994 |
| JP | H8-55567 A | 2/1996 |
| JP | 8115788 A | 5/1996 |
| JP | 8194437 A | 7/1996 |
| JP | H08-305301 A | 11/1996 |
| JP | 8339034 A | 12/1996 |
| JP | H9-160512 A | 6/1997 |
| JP | H09246766 A | 9/1997 |
| JP | 11160727 A | 6/1999 |
| JP | H11296094 A | 10/1999 |
| JP | 2000-10501 A | 1/2000 |
| JP | 2000131682 A | 5/2000 |
| JP | 2001209126 A | 8/2001 |
| JP | 2001-249402 A | 9/2001 |
| JP | 2002-6282 A | 1/2002 |
| JP | 2002158475 A | 5/2002 |
| JP | 2003-76286 A | 3/2003 |
| JP | 2004053749 A | 2/2004 |
| JP | 2004-199675 A | 7/2004 |
| JP | 2004286940 A | 10/2004 |
| JP | 2005017556 A | 1/2005 |
| JP | 2005134849 A | 5/2005 |
| JP | 2005265922 A | 9/2005 |
| JP | 2005292939 A | 10/2005 |
| JP | 2005332253 A | 12/2005 |
| JP | 2006-32890 A | 2/2006 |
| JP | 2006513577 A | 4/2006 |
| JP | 2006148047 A | 6/2006 |
| JP | 2006163217 A | 6/2006 |
| JP | 2006-176112 A | 7/2006 |
| JP | 2006198344 A | 8/2006 |
| JP | 2007003638 A | 1/2007 |
| JP | 2007-293105 A | 11/2007 |
| JP | 09307257 A | 11/2007 |
| JP | 2007322718 A | 12/2007 |
| JP | 2008010361 A | 1/2008 |
| JP | 2008292743 A | 12/2008 |
| JP | 2009-44262 A | 2/2009 |
| JP | 2010024624 A | 2/2010 |
| JP | 2010-102227 A | 5/2010 |
| JP | 2010-282109 A | 12/2010 |
| JP | 2011-14593 A | 1/2011 |
| JP | 2011-503663 A | 1/2011 |
| JP | 2011-75819 A | 4/2011 |
| JP | 2012-118130 A | 6/2012 |
| JP | 2012-133254 A | 7/2012 |
| JP | 2013-537721 A | 10/2013 |
| JP | 2014-225595 A | 12/2014 |
| JP | 2017518526 A | 7/2017 |
| JP | 2018-511838 A | 4/2018 |
| JP | 6305564 B2 | 4/2018 |
| JP | 2019-512721 A | 5/2019 |
| JP | 6526245 B2 | 5/2019 |
| JP | 6688402 B2 | 4/2020 |
| JP | 6824440 B2 | 1/2021 |
| JP | 6858276 B2 | 3/2021 |
| KR | 20000000118 U | 1/2000 |
| KR | 200163508 Y1 | 7/2000 |
| KR | 20000047899 A | 7/2000 |
| KR | 200206768 Y1 | 12/2000 |
| KR | 200236278 Y1 | 10/2001 |
| KR | 10-2067751 B1 | 1/2002 |
| KR | 2002-0057425 A | 7/2002 |

(56) References Cited

FOREIGN PATENT DOCUMENTS

| | | |
|---|---|---|
| KR | 200286961 Y1 | 8/2002 |
| KR | 1020040067701 A | 7/2004 |
| KR | 200366674 Y1 | 11/2004 |
| KR | 20050033986 A | 4/2005 |
| KR | 200401354 Y1 | 11/2005 |
| KR | 20060016469 A | 2/2006 |
| KR | 10-0563049 B1 | 3/2006 |
| KR | 20060054742 A | 5/2006 |
| KR | 10-2006-0070176 A | 6/2006 |
| KR | 100666961 B1 | 1/2007 |
| KR | 1020070070675 A | 4/2007 |
| KR | 10-2007-0048300 A | 5/2007 |
| KR | 1020070048294 | 8/2007 |
| KR | 10-2013-0126034 A | 11/2013 |
| KR | 101764381 B1 | 7/2017 |
| KR | 10-1847151 B1 | 4/2018 |
| KR | 10-1853885 B1 | 4/2018 |
| KR | 10-1868077 B1 | 6/2018 |
| KR | 10-1885884 B1 | 7/2018 |
| KR | 10-1894027 B1 | 8/2018 |
| KR | 10-1904363 B1 | 9/2018 |
| KR | 10-1958375 B1 | 3/2019 |
| KR | 10-2010515 B1 | 8/2019 |
| KR | 10-2063885 | 1/2020 |
| KR | 10-2104342 B1 | 4/2020 |
| KR | 10-2109072 B1 | 5/2020 |
| KR | 10-2165778 B1 | 10/2020 |
| KR | 10-2262912 B1 | 6/2021 |
| KR | 10-2267374 B1 | 6/2021 |
| KR | 10-2306650 B1 | 9/2021 |
| KR | 10-2379046 B1 | 3/2022 |
| KR | 10-2400990 B1 | 5/2022 |
| KR | 10-2512657 B1 | 3/2023 |
| RU | 2513043 C2 | 4/2014 |
| WO | WO2005079129 A1 | 8/2005 |
| WO | WO2007/116117 A1 | 10/2007 |
| WO | WO2007116116 A1 | 10/2007 |
| WO | WO2008050660 A2 | 5/2008 |
| WO | WO2008/102050 A1 | 8/2008 |
| WO | WO2009/047390 A1 | 4/2009 |
| WO | WO2009065125 A2 | 5/2009 |
| WO | WO2009065125 A3 | 5/2009 |
| WO | WO2009135308 A1 | 11/2009 |
| WO | WO2010007821 A1 | 2/2010 |
| WO | WO2010080624 A2 | 7/2010 |
| WO | WO2011059793 A2 | 5/2011 |
| WO | WO2011069084 A3 | 6/2011 |
| WO | WO2011072217 A3 | 6/2011 |
| WO | WO2011140179 A2 | 11/2011 |
| WO | WO2011150078 A2 | 12/2011 |
| WO | WO2012006620 A2 | 1/2012 |
| WO | WO2012021573 A2 | 2/2012 |
| WO | WO2012024426 A3 | 2/2012 |
| WO | 2012/035362 A1 | 3/2012 |
| WO | WO2013/182733 A1 | 12/2013 |
| WO | WO2014062815 A1 | 4/2014 |
| WO | 2014/122943 A1 | 8/2014 |
| WO | WO2014149773 A1 | 9/2014 |
| WO | WO2014150036 A1 | 9/2014 |
| WO | 2014/195560 A1 | 12/2014 |
| WO | WO2015/138609 A2 | 9/2015 |
| WO | WO2015168375 A1 | 11/2015 |
| WO | WO2016/102980 A1 | 6/2016 |
| WO | WO2016102982 A1 | 6/2016 |
| WO | WO2016127613 A1 | 8/2016 |
| WO | WO2016133852 A1 | 8/2016 |
| WO | WO2017152166 A1 | 9/2017 |
| WO | 2018/185364 A1 | 10/2018 |
| WO | WO2018/200260 A1 | 11/2018 |
| WO | WO2018/200905 A1 | 11/2018 |
| WO | 2020028045 A1 | 2/2020 |
| WO | WO2020/081687 A1 | 4/2020 |
| WO | WO2020/205305 A1 | 10/2020 |
| WO | WO2022/087488 A1 | 4/2022 |
| WO | 2024/049953 A1 | 3/2024 |

OTHER PUBLICATIONS

Rohsenow, Warren M., Handbook of Heat Transfer, Third Edition, 1998, select chapters, 112 pages, McGraw-Hill.
The American Heritage College Dictionary, Third Edition, 1993, excerpt, 3 pages, Houghton Mifflin Company.
*Civiq Smartscapes LLC.* v *Manufacturing Resources International, Inc.*, Petition for Inter Partes Review of U.S. Pat. No. 8,854,572 including Declaration of Greg Blonder in Support of Petition, Curriculum Vitae of Greg Blonder and Prosecution History of U.S. Pat. No. 8,854,572, Petition filed Mar. 14, 2018, 427 pages.
*Civiq Smartscapes LLC.* v *Manufacturing Resources International, Inc.*, Defendant's Amended Answer and Counterclaims to Plaintiff's First Amended Complaint, Filed Apr. 24, 2018, 240 pages.
*Civiq Smartscapes LLC.* v *Manufacturing Resources International, Inc.*, Memorandum Order re "rear surface of the electronic display" term construction, Mar. 5, 2019, 3 pages.
United States International Trade Commission, *Manufacturing Resources International, Inc.* v *Samsung Electronics Co., Ltd* et al., In the Matter of Certain Outdoor and Semioutdoor Electronic Displays, Products Containing Same, and Components Thereof, Inv. No. 337-TA-1331, Final Initial Determination of Violation of Section 337, Public Version, Nov. 13, 2023, 325 pages.
Declaration of Robert Smith Gillespie, Certain Outdoor and Semi-outdoor Electronic Displays, Products, Containing same, and Components thereof, Jan. 17, 2023, 42 pages.
*Samsung Electronics Co., Ltd. and Samsung Electronics America, Inc.* v *Manufacturing Resources International, Inc.*, Declaration of Michael Gershowitz, Sep. 26, 2023, 77 pages.
*Samsung Electronics Co., Ltd. and Samsung Electronics America, Inc.* v *Manufacturing Resources International, Inc.*, Expert Declaration of Dr. Himanshu Pokhama,, Sep. 26, 2023, 104 pages.
*Samsung Electronics Co., Ltd. and Samsung Electronics America, Inc.* v *Manufacturing Resources International, Inc.*, Decision to Institute IPR2023-00199, Jun. 20, 2023, 53 pages.
*Samsung Electronics Co., Ltd. and Samsung Electronics America, Inc.* v *Manufacturing Resources International, Inc.*, Decision to Institute IPR2023-00220, Jun. 20, 2023, 51 pages.
*Samsung Electronics Co., Ltd. and Samsung Electronics America, Inc.* v *Manufacturing Resources International, Inc.*, Decision to Institute IPR2023-00221, Jun. 20, 2023, 80 pages.
*Samsung Electronics Co., Ltd. and Samsung Electronics America, Inc.* v *Manufacturing Resources International, Inc.*, Decision to Institute IPR2023-00254, Jun. 20, 2023, 72 pages.
*Samsung Electronics Co., Ltd. and Samsung Electronics America, Inc.* v *Manufacturing Resources International, Inc.*, Decision to Institute IPR2023-00255, Jul. 18, 2023, 47 pages.
*Samsung Electronics Co., Ltd. and Samsung Electronics America, Inc.* v *Manufacturing Resources International, Inc.*, Final Written Decision IPR2023-00199, Jul. 3, 2024, 78 pages.
*Samsung Electronics Co., Ltd. and Samsung Electronics America, Inc.* v *Manufacturing Resources International, Inc.*, Final Written Decision IPR2023-00220, Jul. 3, 2024, 78 pages.
*Samsung Electronics Co., Ltd. and Samsung Electronics America, Inc.* v *Manufacturing Resources International, Inc.*, Final Written Decision IPR2023-00254, Jul. 3, 2024, 114 pages.
*Samsung Electronics Co., Ltd. and Samsung Electronics America, Inc.* v *Manufacturing Resources International, Inc.*, Final Written Decision IPR2023-00221, Jul. 3, 2024, 116 pages.
*Samsung Electronics Co., Ltd. and Samsung Electronics America, Inc.* v *Manufacturing Resources International, Inc.*, Final Written Decision IPR2023-00255, Jul. 30, 2024, 94 pages.
The Free Dictionary, Bolt—Definition of bolt by The Free Dictionary, Jun. 15, 2016, 1 Page.
The Free Dictionary, Screw—Definition of screw by The Free Dictionary, Jun. 15, 2016, 1 Page.
I-Tech Company, 65" Outdoor Digital Signage Sunlight All Weather Proof LCD, 1 Page.
sunlightlcd.com, 46" All Weather NEMA4 Outdoor High Brightness (Model: GS4600L), Mar. 11, 2009, 2 Pages.
Vertigo Digital Displays, Innovation on Display FlexVu Totem Brochure, 2014, 6 pages.
Vertigo Digital Displays, FlexVu Totem Shelter, 2017, 2 pages.

(56) References Cited

OTHER PUBLICATIONS

Vertigo Digital Displays, All Products Catalogue, 2017, 14 pages.
Adnation, Turn Key Advertising Technology Solutions, May 23, 2017, 4 pages.
Civiq Smartscapes, FlexVue Ferro 55P/55L, Mar. 16, 2017, 4 pages.
Civiq, Invalidity Contentions, Jan. 24, 2018, 51 pages.
Civiq, Invalidity Claim Chart, Appendix E, Jan. 24, 2018, 28 pages.
Civiq, Invalidity Claim Chart, Appendix I, Mar. 22, 2018, 4 pages.
Civiq, Smart City Devices, webpage, Jan. 30, 2019, 5 pages.
Civiq, Smart City Platform, webpage, Jan. 30, 2019, 10 pages.
Civiq, Smartscapes devices, webpage, Jan. 30, 2019, 1 page.
Miller, Adnation, photos, May 9, 2017, 28 pages.
Itsenclosures, Product Catalog, 2009, 48 pages.
Itsenclosures, Standard Product Data Sheet, 2011, 18 pages.
Sunbritetv, All Weather Outdoor LCD Television Model 4610HD, 2008, 1 page.
Sunbritetv, Introduces Two New All-Weather Outdoor Televisions InfoComm 2008, 7 pages.
Itsenclosures, Viewstation, 2017, 16 pages.
Novitsky, Driving LEDs versus CCFLs for LCD backlighting, Nov. 12, 2007, 6 pages.
Federman, Cooling Flat Panel Displays, 2011, 4 pages.
Zeeff, T.M., EMC analysis of an 18" LCD monitor, 2000, 1 page.
Wankhede, Evaluation of Cooling Solutions for Outdoor Electronics, Sep. 17-19, 2007, 6 pages.
Bureau of Ships Navy Department, Guide Manual of Cooling methods for Electronic Equipment, Mar. 31, 1955, 212 pages.
Civiq, Invalidity Claim Charts, Appendix A—Appendix D, Jan. 24, 2018, 51 pages.
Scott, Cooling of Electronic Equipment, Apr. 4, 1974, 119 pages.
Sergent, Thermal Management Handbook for Electronic Assemblies, Aug. 14, 1998, 190 pages.
Steinberg, Cooling Techniques for Electronic Equipment First Edition, 1980, 255 pages.
Steinberg, Cooling Techniques for Electronic Equipment Second Edition, 1991, 299 pages.
Yeh, Thermal Management of Microelectronic Equipment, Oct. 15, 2002, 148 pages.
Civiq, Invalidity Claim Charts, Appendix F to H, Mar. 22, 2018, 18 pages.
Yung, Using Metal Core Printed Circuit Board as a Solution for Thermal Management article, 2007, 5 pages.
*Civiq Smartscapes, LLC* v. *Manufacturing Resources International, Inc.*, Memorandum Opinion re claim construction, Sep. 27, 2018, 16 pages.
*Civiq Smartscapes, LLC* v. *Manufacturing Resources International, Inc.*, Claim Construction Order, Oct. 3, 2018, 2 pages.
Anandan, Munismay, Progress of LED backlights for LCDs, Journal of the SID, 2008, pp. 287-310, 16/2.
Melford Technologies, Part 2, video online at https://m.youtube.com/watch?v=znlyHWozwDA, Oct. 21, 2019, 1 page.

* cited by examiner

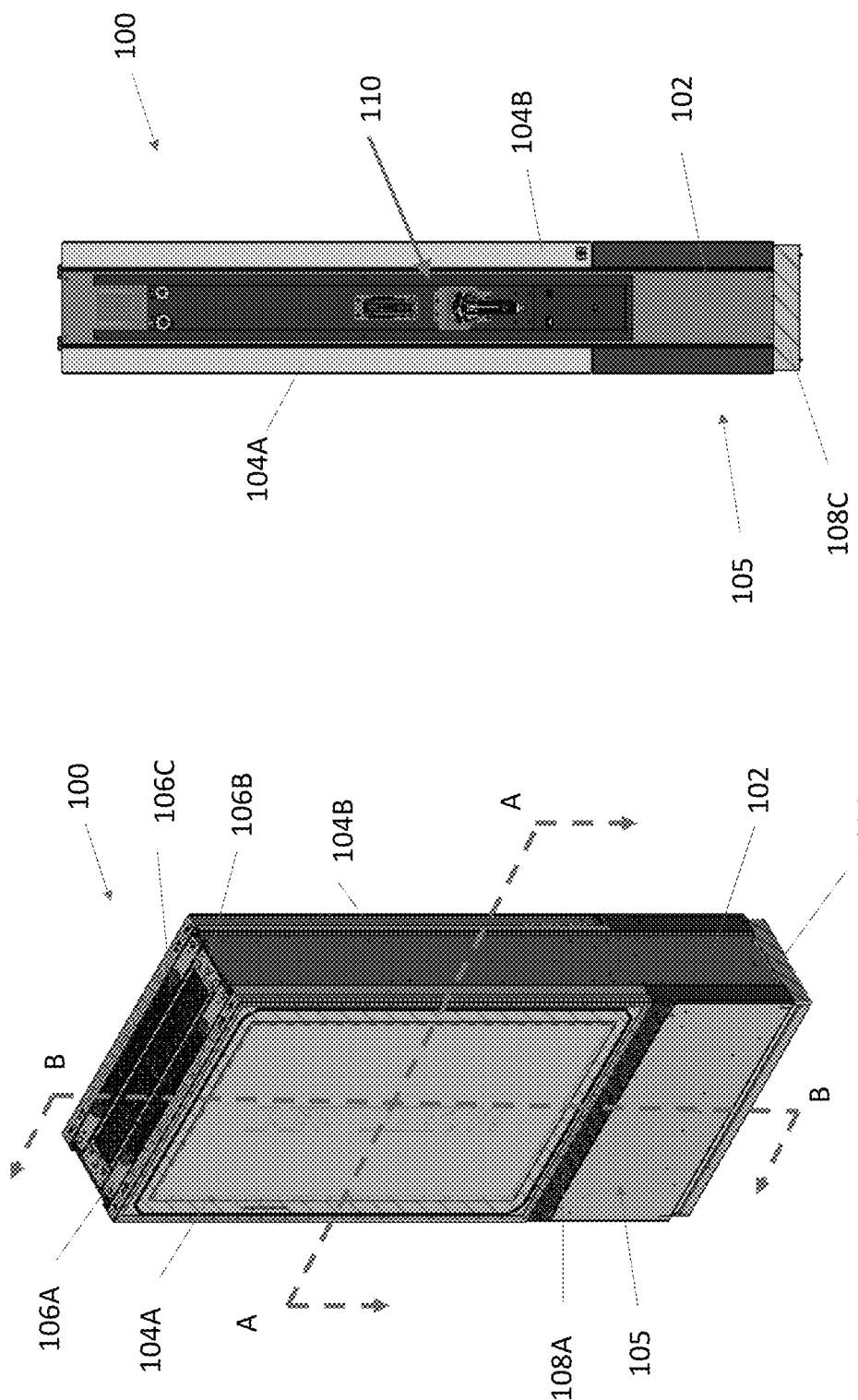

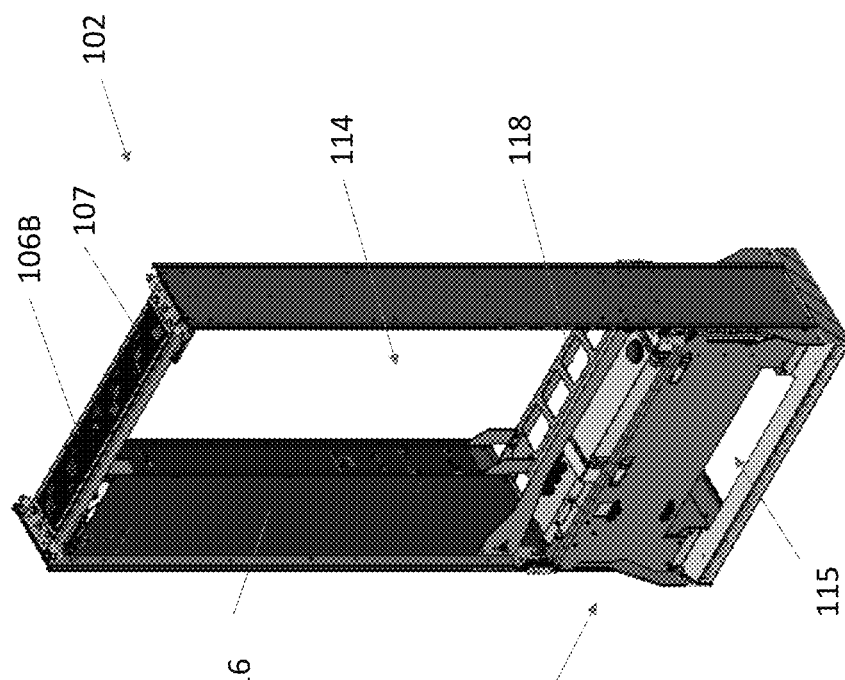
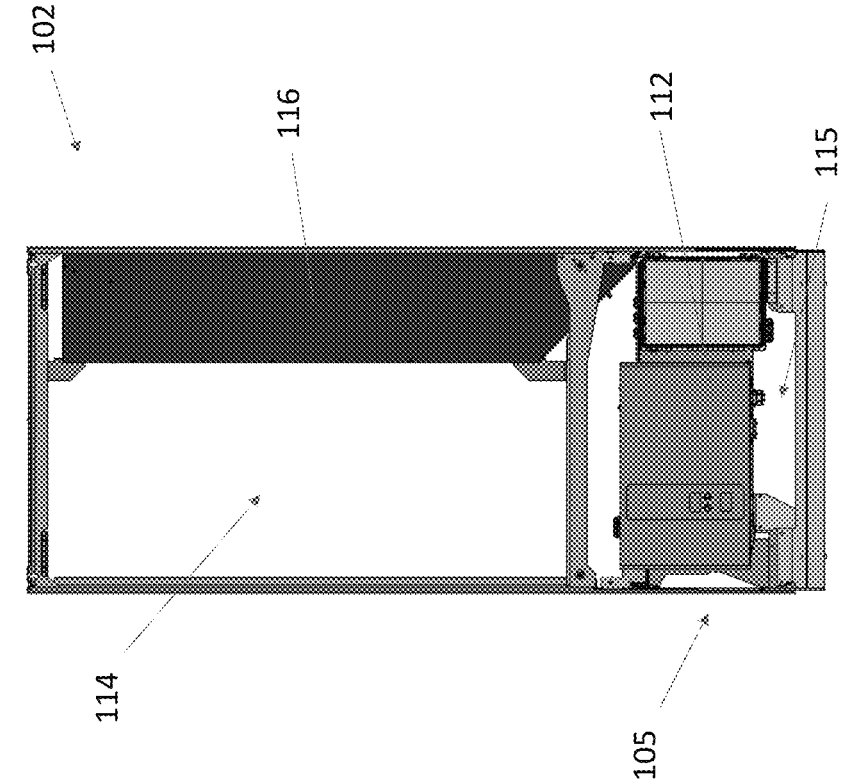

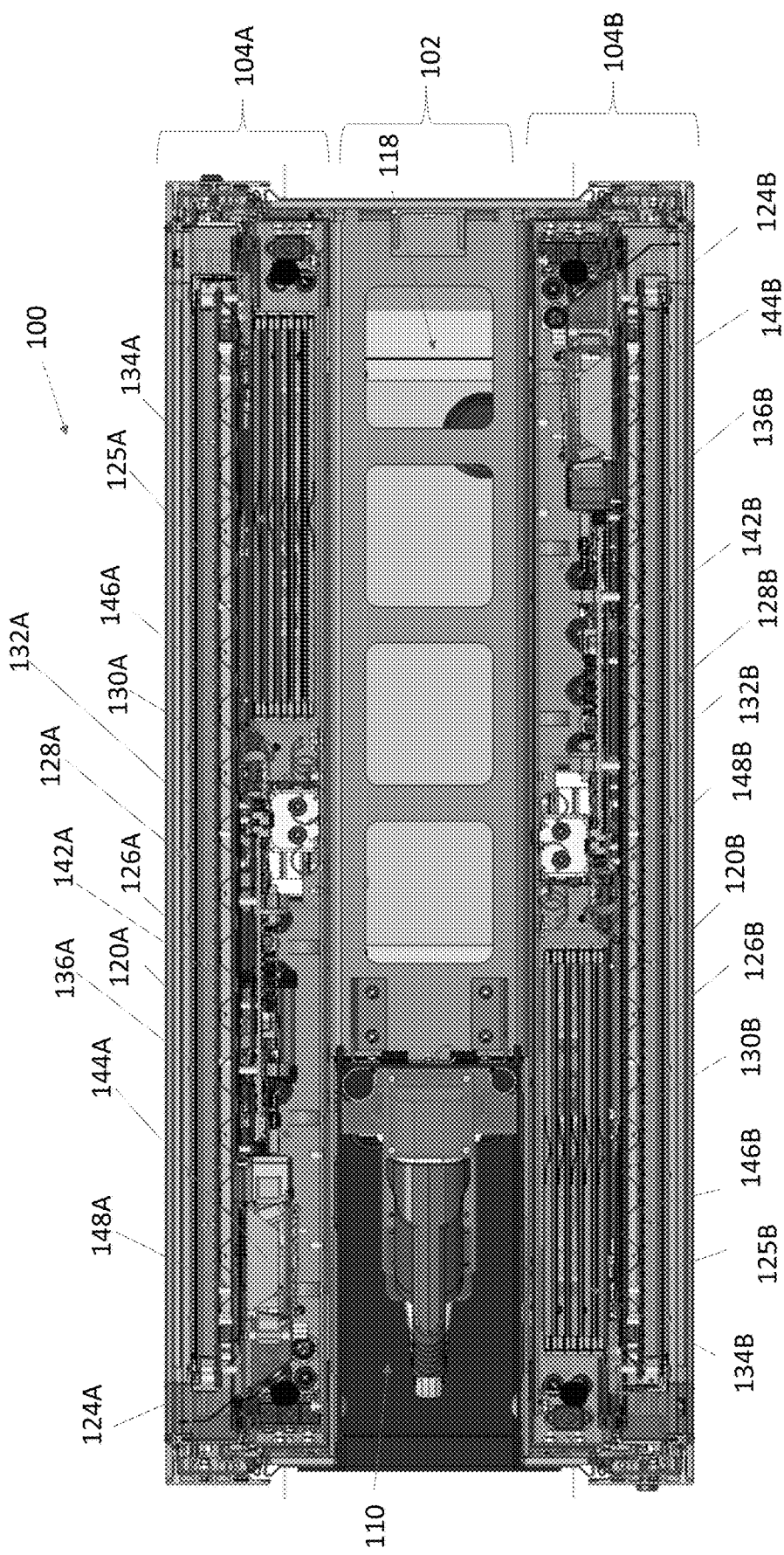

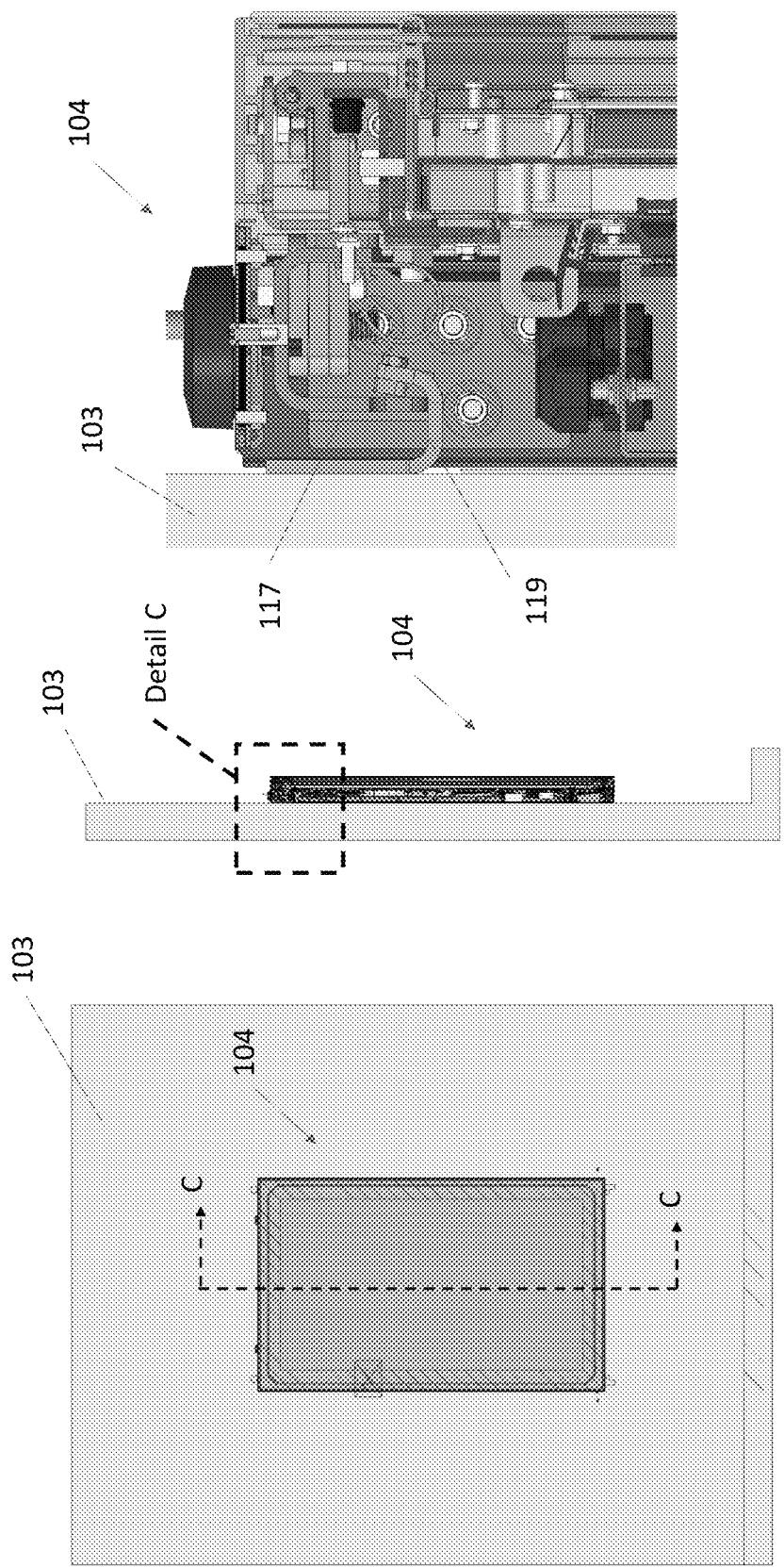

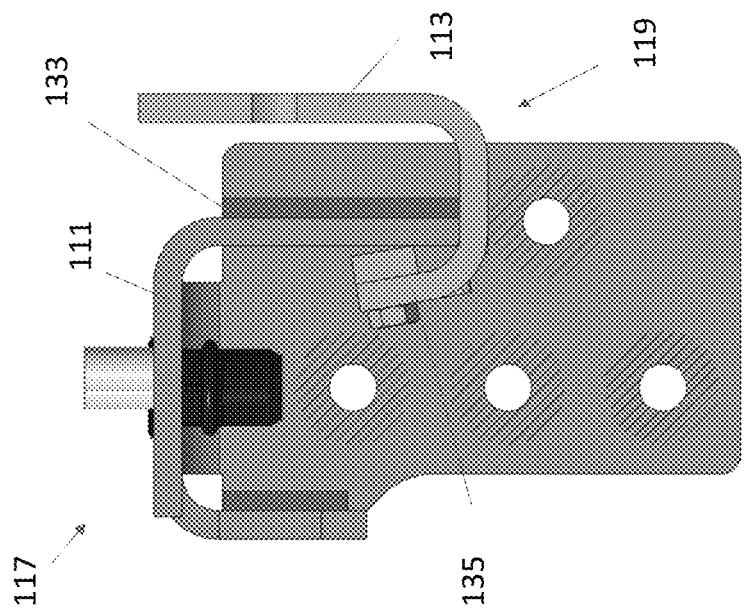
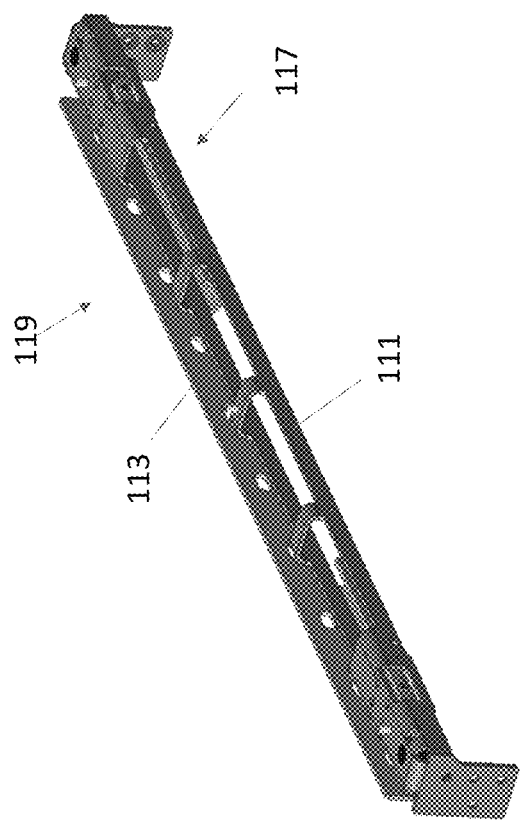

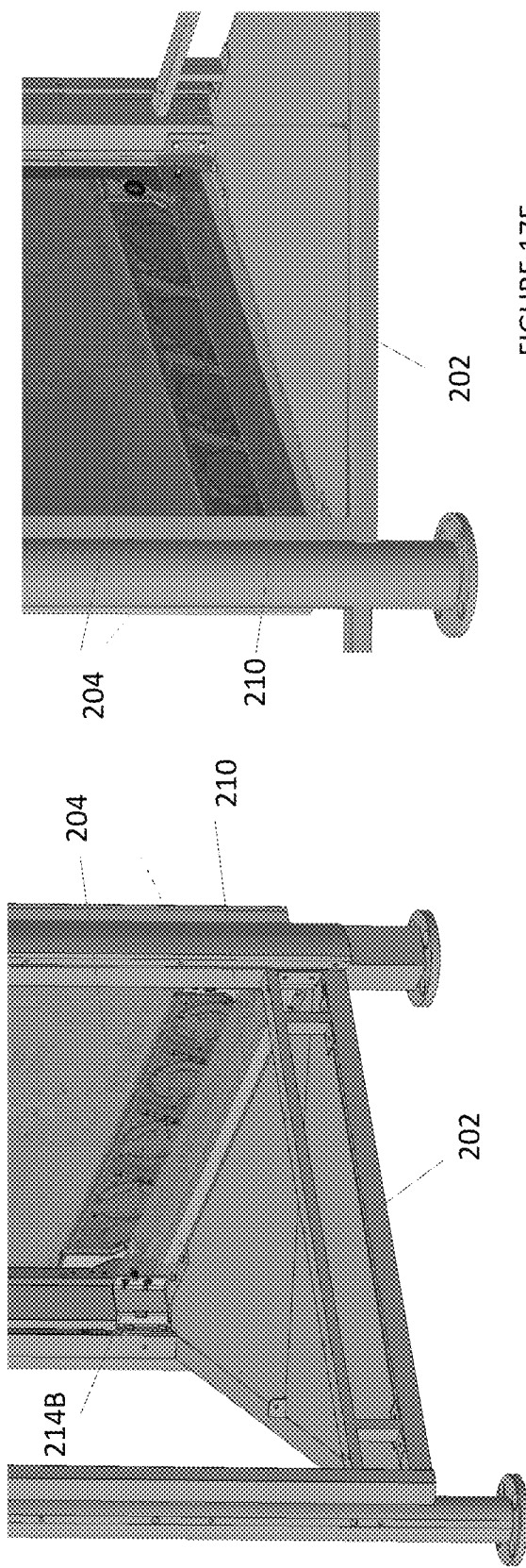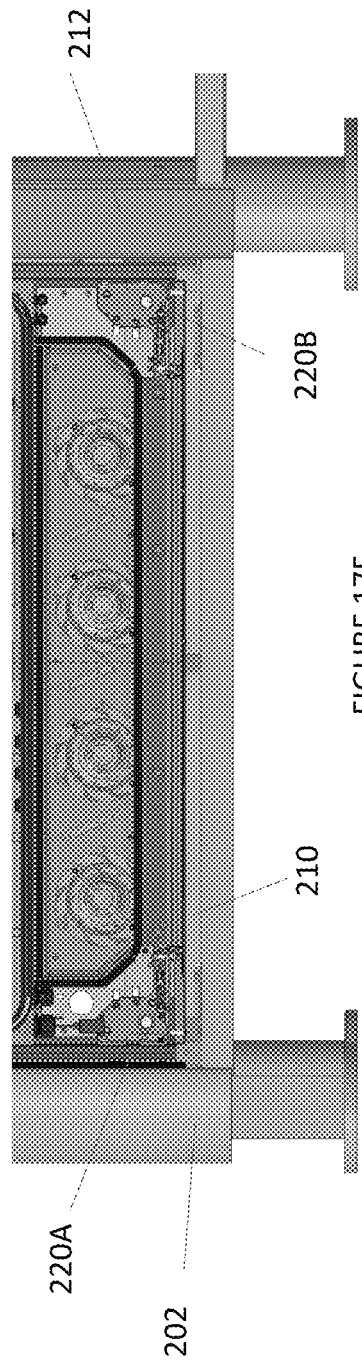

SELF-CONTAINED ELECTRONIC DISPLAY ASSEMBLY, MOUNTING STRUCTURE AND METHODS FOR THE SAME

CROSS-REFERENCE TO RELATED APPLICATIONS

This application is a continuation of U.S. application Ser. No. 18/750,389 filed Jun. 21, 2024, which is a divisional of U.S. application Ser. No. 18/233,525 filed Aug. 14, 2023, now U.S. Pat. No. 12,072,561 issued Aug. 27, 2024, which is a continuation-in-part of U.S. application Ser. No. 17/870,913 filed Jul. 22, 2022, now U.S. Pat. No. 12,010,813 issued Jun. 11, 2024, the disclosures of which are hereby incorporated by reference as if fully restated herein.

TECHNICAL FIELD

Exemplary embodiments relate generally to self-contained electronic display assemblies as well as mounting structures and methods related to the same.

BACKGROUND AND SUMMARY OF THE INVENTION

The demand for digital out of home ("DOOH") advertising units has grown significantly in recent years. However, public and private real-estate space remains highly sought after and expensive. Advertisers are increasingly looking for new areas and mediums to provide advertising and other public announcement opportunities. What is needed is a display assembly that is adapted for installation at a variety of environments.

A self-contained electronic display assembly, as well as a mounting structure and methods for the same are provided. The disclosed self-contained electronic display assembly is adapted for installation at a variety of environments, such as by virtue of its largely, or entirely, self-contained nature. The mounting structure is highly adaptable for relatively simple installation in a number of different environments. Each of the electronic display assemblies may comprise a dedicated open loop airflow pathway and/or a dedicated closed loop airflow pathway. The closed loop airflow pathway may encircle an electronic display. The open loop airflow pathway may extend along a backlight for the electronic display. Other airflow configurations may be utilized.

The mounting structure may be configured to flexibly accommodate a variety of electronic equipment. Some or all of the electronic equipment may not necessarily be required for operation of the electronic display assemblies. For example, without limitation, the mounting structure may be configured to accommodate and/or provide electrical power and/or network connectivity to, electric vehicle ("EV") charging equipment, power transformers, traffic control devices, parking meters, street lighting equipment, and/or other civil or government and/or privately owned equipment. This may permit increased opportunity to place units within existing street or other public spaces.

The mounting structure may be configured to removably accept one or more of the electronic display assemblies. In exemplary embodiments, without limitation, the mounting structure is configured to accept two of the electronic display assemblies on opposing sides thereof.

In exemplary embodiments, without limitation, the mounting structure may comprise one or more hooks. For example, a set of one or more hooks may be installed to, provided at, and/or form part of a framework for connection to a ground surface, wall, or the like, and/or directly to a wall or other structure without the need for a separate framework. A complementary set of one or more hooks may be installed to, provided at, and/or form part of the electronic display assemblies. The hooks may be configured to mate with one another, preferably in a selectively removable fashion such that the electronic display assemblies may be removably installed. The complementary hooks may be configured to permit rotational movement of the electronic display assemblies when mounted. This arrangement may be used for newly constructed and/or installed units and/or to retrofit existing street furniture and other structures, such as but not limited to bus shelters.

The mounting structure may comprise a dedicated, open loop airflow pathway between the electronic display assemblies to thermally manage some or all of the electronic equipment. The open loop airflow pathway of the mounting structure may be wholly or partially separate from the open and/or closed loop airflow pathways of the electronic display assemblies, such as in accordance with various ingress protection ("IP") standards.

The mounting structure may be relatively compact for transportation. The mounting structure may permit removable attachments of the electronic display assemblies such that they may be removed for proper orientation during transport.

Alternative to a dedicated mounting structure, the electronic display assemblies may be configured for mounting to existing building walls, EV charging equipment, power transformers, traffic control devices, parking meters, street lighting equipment, and/or other civil or government and/or privately owned equipment or other buildings, structures, and/or surfaces.

Further features and advantages of the systems and methods disclosed herein, as well as the structure and operation of various aspects of the present disclosure, are described in detail below with reference to the accompanying figures.

BRIEF DESCRIPTION OF THE DRAWINGS

In addition to the features mentioned above, other aspects of the present invention will be readily apparent from the following descriptions of the drawings and exemplary embodiments, wherein like reference numerals across the several views refer to identical or equivalent features, and wherein:

FIG. 1 is a perspective view of an exemplary display assembly also illustrating section lines A-A and B-B;

FIG. 2 is a side view of the display assembly of FIG. 1;

FIG. 6 is a front view of the mounting structure of FIG. 5 with the side assemblies also removed;

FIG. 7 is a perspective view of the mounting structure of FIG. 6;

FIG. 11B is a top sectional view taken along section line A-A of FIG. 1;

FIG. 12A is a front view of the side assembly separately installed to an exemplary surface in an exemplary fashion;

FIG. 12B is a side sectional view of the installed side assembly of FIG. 12A taken along section line C-C;

FIG. 12C is a detailed side view of detail C of FIG. 12B;

FIG. 13A is a perspective view of an exemplary mounting structure of FIGS. 12A-12C shown in insolation;

FIG. 13B is a side view of the mounting structure of FIG. 13A;

FIG. 17D is a detailed rear perspective view of the mounted display of FIGS. 16A and 16F;

FIG. 17E is another detailed rear perspective view of the mounted display of FIG. 17D; and FIG. 17F is a detailed rear view of the mounted display of FIG. 17D.

DETAILED DESCRIPTION OF EXEMPLARY EMBODIMENT(S)

Figure 4:
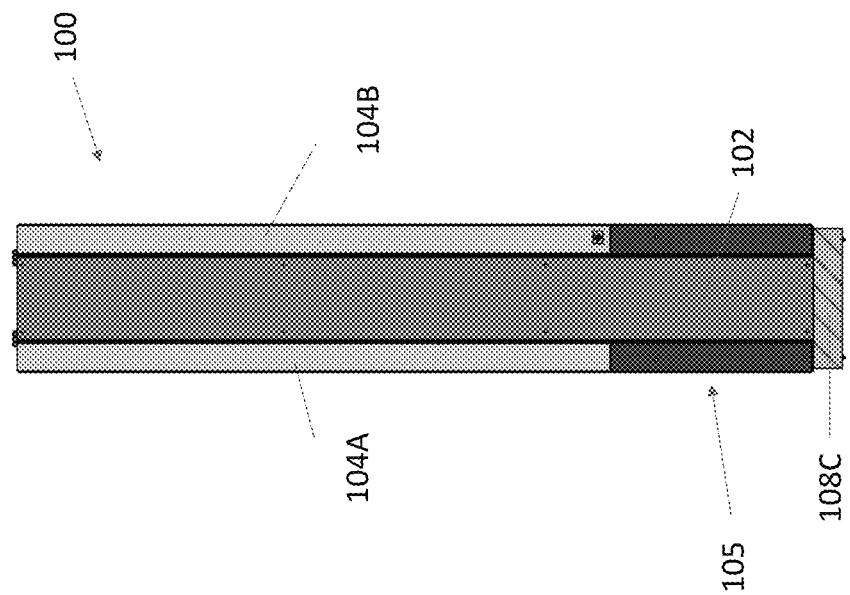
FIG. 4 is a side view of the display assembly of FIG. 1.
Figure 3:
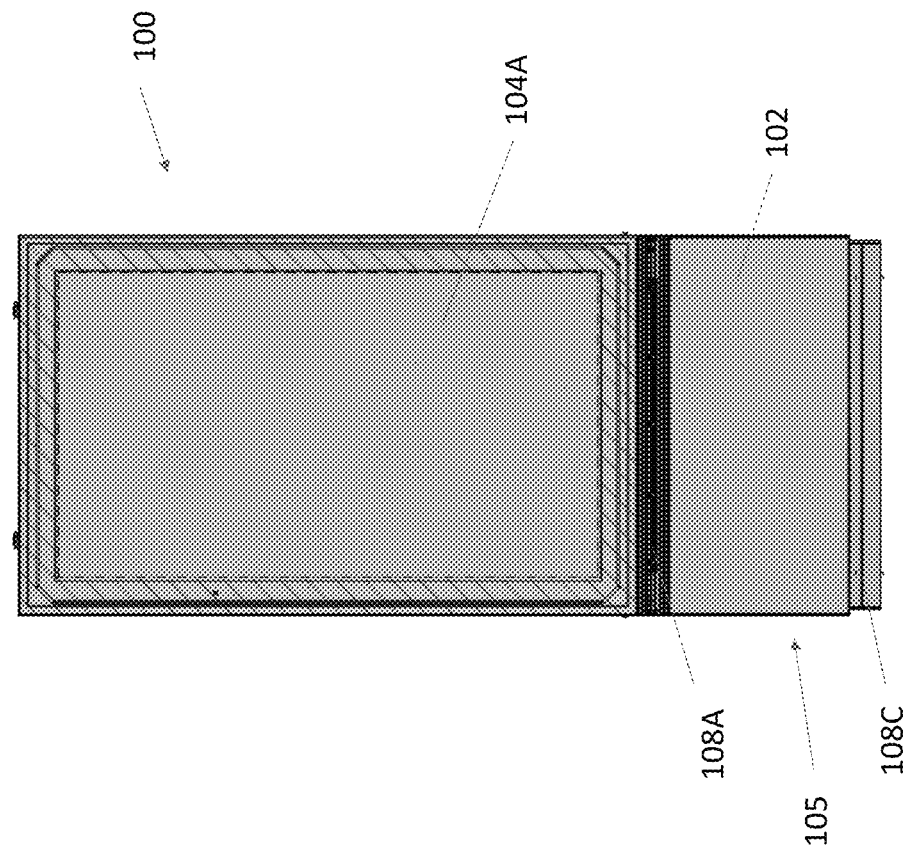
FIG. 3 is a front view of the display assembly of FIG. 1.

Various embodiments of the present invention will now be described in detail with reference to the accompanying drawings. In the following description, specific details such as detailed configuration and components are merely provided to assist the overall understanding of these embodiments of the present invention. Therefore, it should be apparent to those skilled in the art that various changes and modifications of the embodiments described herein can be made without departing from the scope and spirit of the present invention. In addition, descriptions of well-known functions and constructions are omitted for clarity and conciseness.

Embodiments of the invention are described herein with reference to illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

FIG. 1 through FIG. 4 illustrate an exemplary display assembly 100. The assembly 100 may comprise a mounting structure 102. The mounting structure 102 may be configured to accept one or more side assemblies 104. The side assemblies 104 sometimes also being referred to electronic display assemblies 104, or individually as an electronic display assembly 104. In exemplary embodiments, without limitation, the mounting structure 102 may be configured to receive a first side assembly 104A on a first side of the mounting structure 102 and a second side assembly 104B on a second side of the mounting structure 102, which may oppose the first side of the mounting structure 102. However, the mounting structure 102 may be configured to accept any number of side assemblies 104 in any arrangement.

The mounting structure 102 may be configured to for connection to a surface, such as but not limited to, a ground surface, a sidewalk, parking lot, a street, a building wall, poles, electrical boxes, transformers, ceilings, floors, combinations thereof, or the like. Alternatively, or additionally, the electronic display assemblies 104 may be configured for mounting directly to a ground surface, a sidewalk, parking lot, a street, a building wall, poles, electrical boxes, transformers, ceilings, floors, combinations thereof, or the like, without the need for a dedicated mounting structure 102, and/or such items may serve as part or all of the mounting structure 102.

The mounting structure 102 may comprise one or more structural members formed into a frame. Any number, size, and/or shape of structural members formed into any size and/or shape frame may be utilized. The mounting structure 102 may comprise one or more cladding components, panels, combinations thereof, or the like. For example, without limitation, the cladding components, panels, or the like may be snap fitted, fastened, adhered, hung, and/or otherwise connected to the structural members to form at least part of a housing.

The mounting structure 102 may comprise one or more apertures or other features configured to accept fasteners, adhesives, structural members, combinations thereof, or the like, for connecting the mounting structure 102 to a surface. The mounting structure 102 may comprise one or more apertures, pass through devices, combinations thereof, or the like, for accepting electrical and/or communication network wires and/or cables, such as for connecting components to utility power and/or communications networks such as the world wide web.

In exemplary embodiments, without limitation, the mounting structure 102 may be configured to accept the side assemblies 104 in a manner which permits movement of the side assemblies 104, such as between a closed position where the side assemblies 104 rest against, and/or are secured to, the mounting structure 102 and an opened position where the side assemblies 104 are moved away from the mounting structure 102. Movement may be provided in a hinging manner or otherwise.

The mounting structure 102 may comprise, or be configured to accept, electric vehicle ("EV") charging equipment 110. In exemplary embodiments, the display assembly 100 may comprise a recessed compartment 116 which extends within a portion of the mounting structure 102 and which is configured to accept certain EV charging equipment 110 such as, but not limited to, cables, connectors, plugs, outlets, user interfaces, point of sale devices, pulleys, retractable coils, combinations thereof, or the like. In exemplary embodiments, a user facing portion of the EV charging equipment 110 may be located at, or within, external facing portions of the recessed compartment 116 while other components of the EV charging equipment 110 may be located at, or within, the mounting structure 102.

The assembly 100 may comprise one or more intake areas 106. In exemplary embodiments, the mounting structure 102 may comprise a first intake area 106B and each of the side assemblies 104 may comprise an additional intake area 106A, 106C, though one or more common intakes 106 may be utilized. The intake areas 106 may comprise, for example, without limitation, one or more apertures, grates, filters, screens, combinations thereof, or the like. The intake areas 106 may be configured to accept ambient air from outside the assembly 100. Alternatively, the mounting structure 102 may comprise the additional intake areas 106A, 106C which may be in fluid communication with the side assemblies 104.

The mounting structure 102 and/or the side assemblies 104 may comprise one or more exhaust areas 108. In exemplary embodiments, without limitation, one of the exhaust areas 108A, 108B may be associated with each of the side assemblies 104A, 104B. For example, without limitation, the exhaust areas 108A, 108B may be provided at a lower portion of the side assemblies 104A, 104B or at the mounting structure 102 along the lower edge of the side assemblies 104A, 104B. A first one of the exhaust areas 108A may be associated with a first one of the side assemblies 104A and located at a first side of the assembly 100 while a second one of the exhaust areas 108B may be associated with a second one of the side assemblies 104B and located at a second side of the assembly 100 in exemplary embodiments, without limitation. Each of the exhaust areas 108A, 108B may be in fluid communication with a respective one of the intake areas 106A, 106C, such that each of the airflows is kept separate, though such is not required. The exhaust areas 108A, 108B may be located elsewhere.

One or more additional exhaust areas 108D, 108D may be provided for the intake area 106B associated with the mounting structure 102. The additional exhaust areas 108C, 108D may be provided at a bottom portion of the mounting structure 102 in exemplary embodiments, without limitation. The additional exhaust areas 108C, 108D may be in fluid communication with the intake area 106B. A first one of the additional exhaust areas 108C may be provided at a first side of the assembly 100 and a second one of the additional exhaust areas 108C may be provided at a second side of the assembly 100, for example, without limitation. The additional exhaust areas 108C, 108D may be located elsewhere.

The exhaust areas 108 may comprise, for example, without limitation, one or more apertures, grates, filters, screens, combinations thereof, or the like. The exhaust areas 108 may be configured to exhaust the ambient air previously ingested through the intake areas 106. In exemplary embodiments, without limitation, each of the exhaust areas 108 may be fluidly connected with just one of the intake areas 106, though common intakes 106 and/or exhausts 108 may be utilized. In other exemplary embodiments, airflow through the assembly 100 may be reversed such that the items shown and/or described as intake areas 106 may serve as exhaust areas 108 and the items shown and/or described as exhaust areas 108 may serve as intake areas 106.

The mounting structure 102 may be configured to interchangeably accept the electronic display assemblies 104, blank covers, static poster holders, combinations thereof, or the like. The electronic display assemblies 104, blank covers, and/or static poster holders may be removed for transportation such that a number of the electronic display assemblies 104, blank covers, and/or static poster holders may be transported in their desired and/or proper orientation, such as with the mounting structure 102. For example, without limitation, all such components may be placed within a single shipping crate in this fashion.

The mounting structure 102, in exemplary embodiments, without limitation, may be first secured at an installation site, such as by passing one or more bolts into an adjacent surface. Power supplies and/or network connectivity wires may be passed into the mounting structure 102, such as but not limited to, by way of one or more pass-through devices, holes, or the like. The electronic display assemblies 104, blank covers, and/or static poster holders may thereafter be installed. The certain components of the assembly 100 may be connected to the power supplies, network connectivity wires, and/or other electronic components, directly or indirectly, as required for operation.

Figure 5:
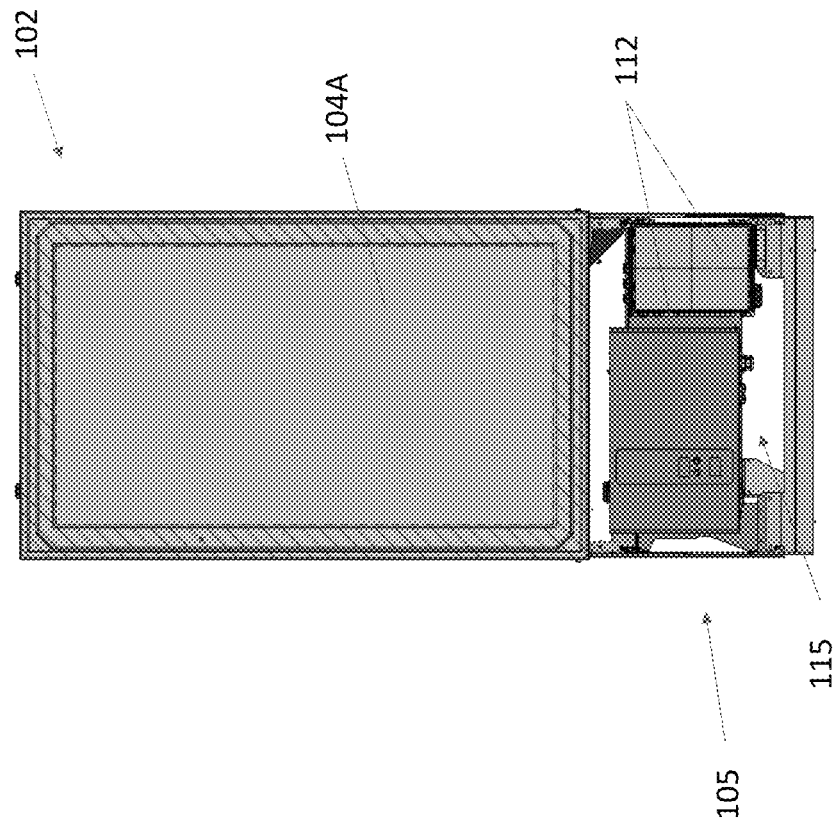
FIG. 5 is a front view of a mounting structure of the display assembly of FIG. 1 with side assemblies installed thereon but certain cladding components removed.

FIG. 5 illustrates the assembly 100 with certain cladding and/or panels removed so as to expose exemplary electronic equipment 112 installed within a lower cavity 115 of a lower area 105. The lower area 105 may comprise an area located below the side assemblies 104 when installed at the mounting structure 102. The lower area 105 and associated lower cavity 115 may be defined, at least in part, by the mounting structure 102.

The electronic equipment 112 may comprise, for example without limitation, EV charging equipment 110 (e.g., power modules, transformers, power distribution modules, power controllers, bulk energy storage devices, AC/DC converters, wiring or cable, combinations thereof, or the like), and/or equipment for side assembly 104 and/or assembly 100 functionality, including but not limited to, power modules, transformers, video players, network connectivity equipment (e.g., wireless transmitters/receivers, routers, radios, antennae, combinations thereof, or the like), sensors (e.g., air quality, pressure, temperature, humidity, accelerometer, magnetometers, combinations thereof, or the like), cameras, microphones, location tracking devices, position measurement systems, communications equipment, electronic storage devices, processors, controllers, edge computing devices, user interfaces, tablet computers, touch screen controllers, point of sale devices, government and/or private equipment (e.g., parking meters, electric meters, utility power supply equipment, traffic controllers, communications network equipment) combinations thereof, or the like. Any type or kind of electronic equipment 112 may be provided. Various structure for accommodating the electronic equipment 112, such as but not limited to, one or more plates, panels, rails, shelves, server racks, combinations thereof, or the like, may be provided within the lower cavity 115.

FIG. 6 and FIG. 7 illustrates the mounting structure 102 with the side assemblies 104 removed. The recessed compartment 116 may be any size and/or shape. In exemplary embodiments, without limitation, the recessed compartment 116 may be sized such that external EV charging equipment 110 is fully recessed within the compartment 116 when properly stowed, though such is not required. The mounting structure 102 may at least partially define an upper cavity 114. The upper cavity 114, in exemplary embodiments without limitation, may be further defined by the side assemblies 104, such as rear surfaces thereof, and the recessed compartment 116. The upper cavity 114 may be located above the lower cavity 115. A series of apertures 118 may extend between the upper cavity 114 and the lower cavity 115 in exemplary embodiments, without limitation. Some or all of the electronic equipment 112 may be located in the upper cavity 114, though such is not required.

The intake area 106B, the upper cavity 114, the lower cavity 115, and/or the exhaust areas 108C and/or 108D may, at least partially, define a central airflow pathway for ambient air. The central airflow pathway may provide a dedicated airflow of ambient air for thermal management of the electronic equipment 112 in exemplary embodiments, without limitation. The central airflow pathway may form an open loop within the assembly 100. The central airflow pathway may be separate from other open loop airflow pathways, such as those provided at the side assemblies 104, such as under various ingress protection ("IP") standards. One or more fan assemblies 107 may be located at the intake area 106B for moving ambient air through the central airflow pathway. Each of the fan assemblies 107 may comprise one or more fans, which may be axial type fans, centrifugal type fans, combinations thereof, or the like.

Figure 9:
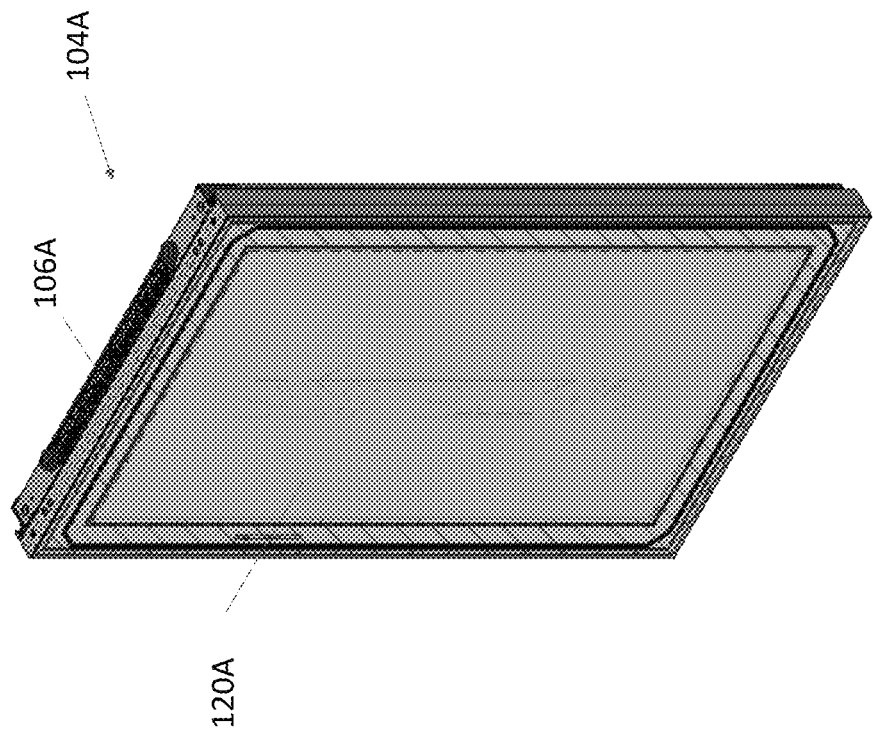
FIG. 9 is a front perspective view of the side assembly of FIG. 8.
Figure 8:
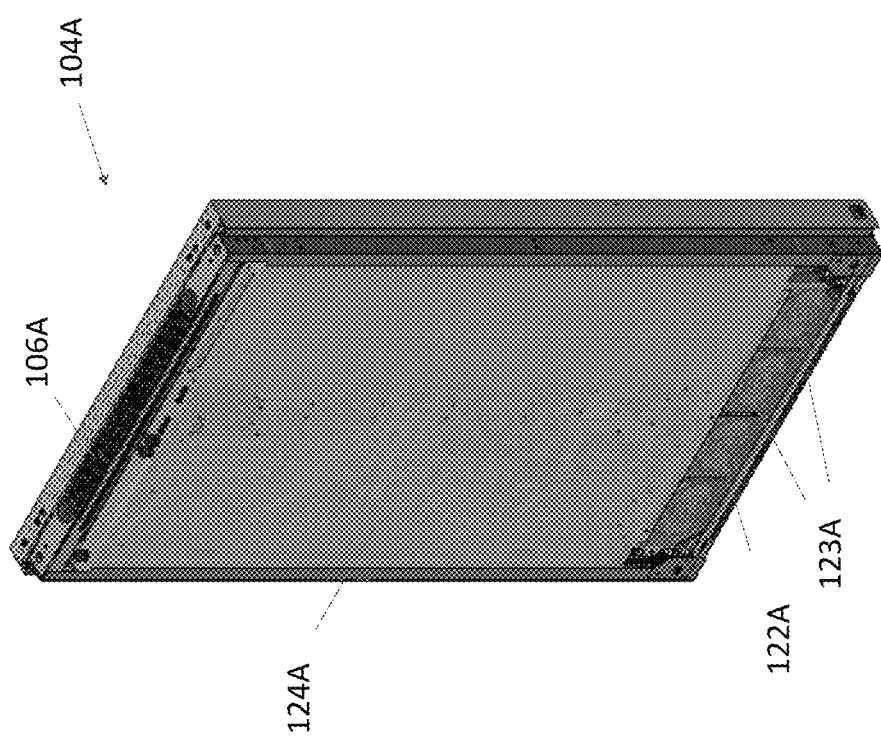
FIG. 8 is a rear perspective view of the side assembly of FIG. 5 illustrated in isolation.

FIG. 8 and FIG. 9 illustrate one of the side assemblies 104A, shown in isolation. Each of the side assemblies 104 may comprise the same, or substantially, the same components in the same, or substantially the same, arrangement, though such is not required. Illustration and/or discussion is sometimes made herein with regard to one of the side assemblies 104A, though similar such components may be provided at other ones of the side assemblies 104B with corresponding item numbers with the addition of a "B" (e.g., 124A to 124B, etc.).

The side assembly 104A may comprise one of the intake areas 106A. The side assembly 104A may comprise a rear cover 124A. A series of side assembly exhausts 122A may be located along a lower edge of the side assembly 104A. The side assembly exhausts 122A may be in fluid communication with the exhaust area 108A. The side assembly 104A may comprise a front cover 120A. Additional details of the side assemblies 104 may be as further provided herein.

FIG. 10A through FIG. 11B illustrate various sectional views of the assembly 100, including the side assemblies 104. Each of the side assemblies 104A, 104B may comprise a cover layer 120A, 120B. The cover layers 120 may each comprise multiple layers which are transparent or translucent (e.g., glass, acrylic) and connected by an optically clear adhesive. However, a single layer may be utilized. One or more polarizers and/or anti-reflective films may be provided at forward or rear surfaces of any of the layers of the covers 120. Each of the side assemblies 104A, 104B may comprise a display layer 126A, 126B. The display layers 126 may each comprise one or more liquid crystal cells, though any type or kind of electronic display may be utilized (e.g., plasma, OLED, projection, cathode ray tube, etc.). Each of the side assemblies 104A, 104B may comprise an illumination device 130A, 130B. The illumination device 130 may comprise one or more light emitting diodes ("LEDs") in exemplary embodiments, without limitation. For example, without limitation, multiple LEDs may be mounted to one or more printed circuit boards arranged to provide direct backlighting to the display layers 126, though any type of lighting and/or arrangement (e.g., edge lighting) may be utilized. A corrugated layer 146A, 146B may extend between each of the illumination devices 130 and a second layer 125A, 125B.

A front channel 128A, 128B may extend between the cover layer 120A, 120B and the display layer 126A, 126B of each of the side assemblies 104A, 104B. A rear channel 136A, 136B may extend between the second layer 124A, 124B and the rear covers 124A, 124B. The front channels 128 may be fluidly connected to the rear channels 136 of the respective side assemblies 104. In exemplary embodiments, without limitation, the front channels 128 and rear channels 136 may define a closed loop airflow pathway for circulating gas within a respective one of the side assemblies 104. The closed loop airflow pathway may surround at least the display layer 126 and the illumination device 125. Alternatively, or additionally, a backlight channel 132A, 132B may extend between the display layers 126A, 126B and the illumination devices 130A, 130B of the side assemblies 104. The backlight channels 132 may be fluidly connected to the front and/or rear channels 128, 136 and form part of the closed loop airflow pathway, though such is not required. A cooling channel 148A, 148B may be provided at each of the side assemblies 104A, 104B between the illumination devices 130A, 130B and the second layers 124A, 124B. The cooling channels 148 may be fluidly connected to one of the intakes 106A, 106C and may be configured to accept ambient air and form part of an open loop airflow pathway at each to the side assemblies 104.

Each of the side assemblies 104A, 104B may comprise one or more fan assemblies 148A, 148B, 123A, 123B. Each of the fan assemblies 148, 123 may comprise one or more fans, which may be axial type fans, centrifugal type fans, combinations thereof, or the like. One or more fan assemblies 148 may be placed within the closed loop airflow pathway of the respective one of the side assemblies 104 for moving circulating gas through the respective closed loop airflow pathway when operated. One or more fan assemblies 123 may be placed within the open loop airflow pathway of the respective one of the side assemblies 104 for moving ambient air through the respective one of the open loop airflow pathways, when operated.

A central airflow pathway may extend within the mounting structure 102, such as between the side assemblies 104 in exemplary embodiments, without limitation. The central airflow pathway may comprise the intake area 106B, the upper cavity 114, the lower cavity 115, and/or the exhaust areas 108C and/or 108D. The exhaust areas 108C, 108D may be common or separate, such as on each side of the mounting structure 102. In this fashion, the central airflow pathway may extend through a middle portion of the display assembly 100. This may provide dedicated cooling to the electronic components 112, in exemplary embodiments. As a great number and/or more power intensive electronic equipment 112 is utilized, increased cooling may be required to optimize component performance and/or longevity. This may also raise the display portions of the side assemblies 104, such as to a more ergonomic viewing height.

The side assemblies 104A, 104B may comprise additional electronic components 142A, 142B, such as for operating various components of the display assembly 100 and/or side assemblies 104A, 104B. The additional electronic components may be located within the rear channels 136. The additional electronic components 142 may comprise, for example without limitation, power modules, transformers, video players, network connectivity equipment (e.g., wireless transmitters/receivers, routers, radios, antennae, combinations thereof, or the like), sensors (e.g., air quality, pressure, temperature, humidity, accelerometer, magnetometers, combinations thereof, or the like), cameras, microphones, location tracking devices, position measurement systems, communications equipment, electronic storage devices, processors, controllers, edge computing devices, combinations thereof, or the like.

The side assemblies 104A, 104B may comprise heat exchangers 134A, 134B. The heat exchangers 134 may comprise multiple layers, such as but not limited to, for accommodating ambient air as part of the open loop airflow pathways and circulating gas as part of the closed loop airflow pathways in an alternating, cross-flow arrangement. However, any type or kind of heat exchangers 134 may be utilized. The open loop portions of the heat exchangers 134 may be in fluid communication with the intakes area 106 and exhaust areas 108, and the closed loop portions of the heat exchangers 134 may be in fluid communication with the front, rear, and/or backlight channels 128, 132, and/or 136. The open loop portions of the heat exchangers 134 may be fluidly connected with the cooling channels 148 or separate therefrom.

The closed loop airflow pathways of the various side assemblies 104 may be separated from one another and/or open loop airflow pathways of the assembly 100, such as by partitions, dividers, walls, panels, gaskets, heat exchangers, seals, combinations thereof, or the like. A complete (e.g., gas impermeable) separation or seal is not necessarily required. In exemplary embodiments, the separation may be sufficient to prevent solid and/or liquid particulate from passing therethrough and/or solid and/or liquid particulate above a given size from passing therethrough. For example, without limitation, such separation may be sufficient to meet certain ingress protection code (IPC) standards, such as but not limited to, IP65, IP66, IP67, or the like.

While EV charging equipment 110 is discussed in some places, any type or kind of equipment 112 may be provided at the display assembly 100, such as but not limited to, within the lower portion 105. Such equipment 112 may comprise, for example without limitation, power transformers, traffic control devices, parking meters, street lighting equipment, and/or other civil or government and/or privately owned equipment, combinations thereof, or the like. Alternatively, or additionally, the mounting structure 102 may be modified to accommodate such equipment 112 and/or other structures, including but not limited to, walls or other surfaces. The side assemblies 104 may be utilized independent of the mounting structure 102, such as for direct mounting to walls, buildings, or other structures.

Figure 10B:
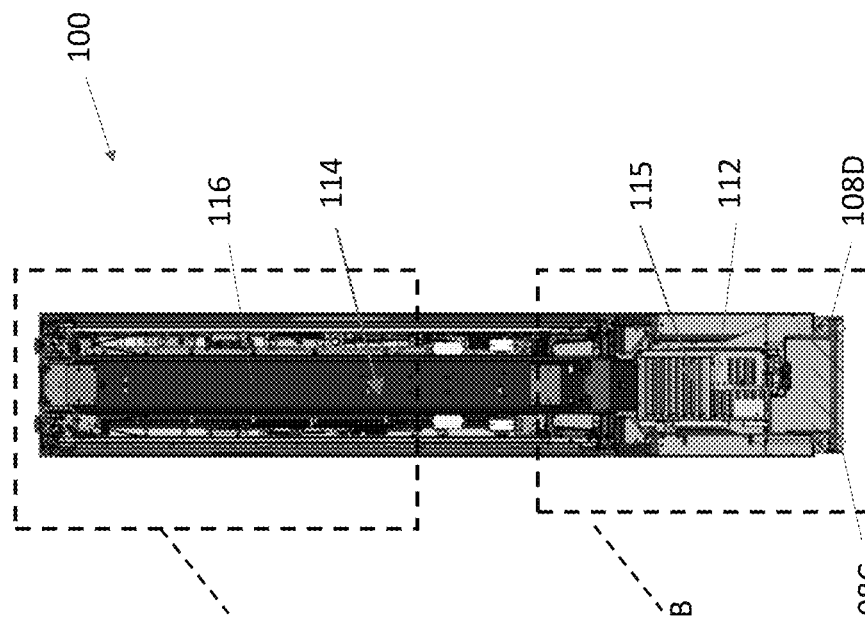
FIG. 10B is a side sectional view of the side assembly of FIG. 10A also indicating detail A and detail B.
Figure 10A:
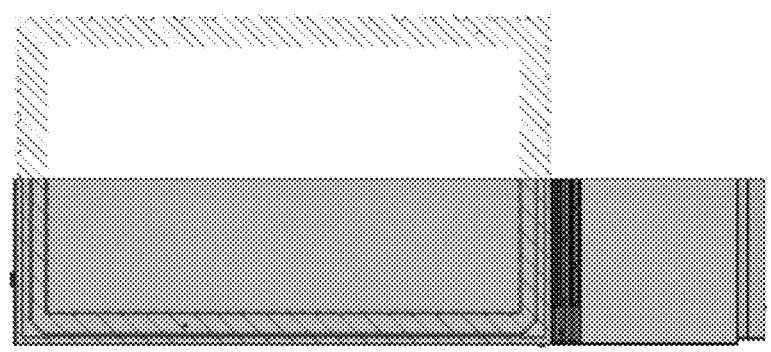
FIG. 10A is a front sectional view of the display assembly of FIG. 1 taken along section line B-B of FIG. 1.
Figure 10C:
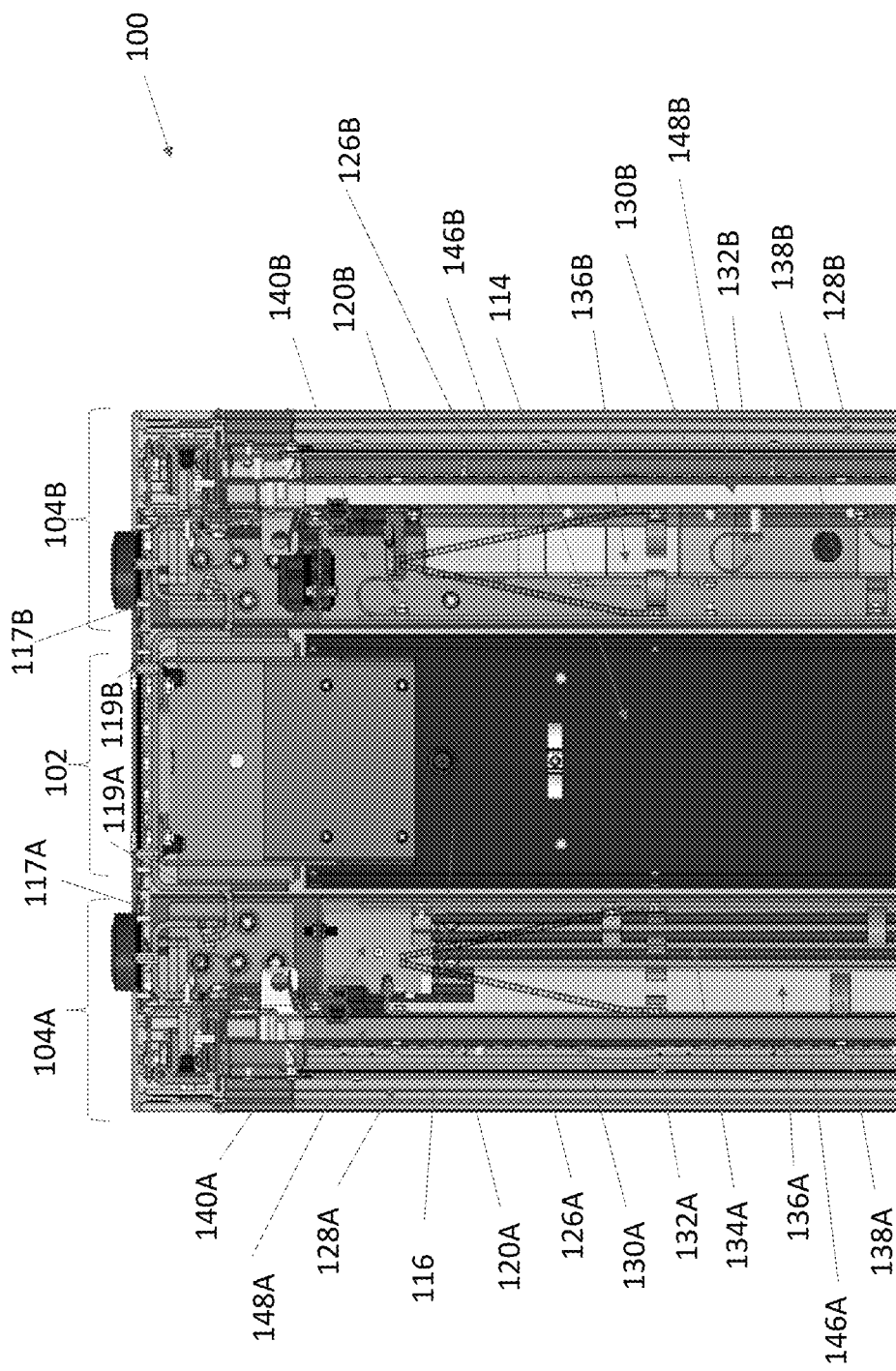
FIG. 10C is a detailed side sectional view of detail A of FIG. 10B.
Figure 10D:
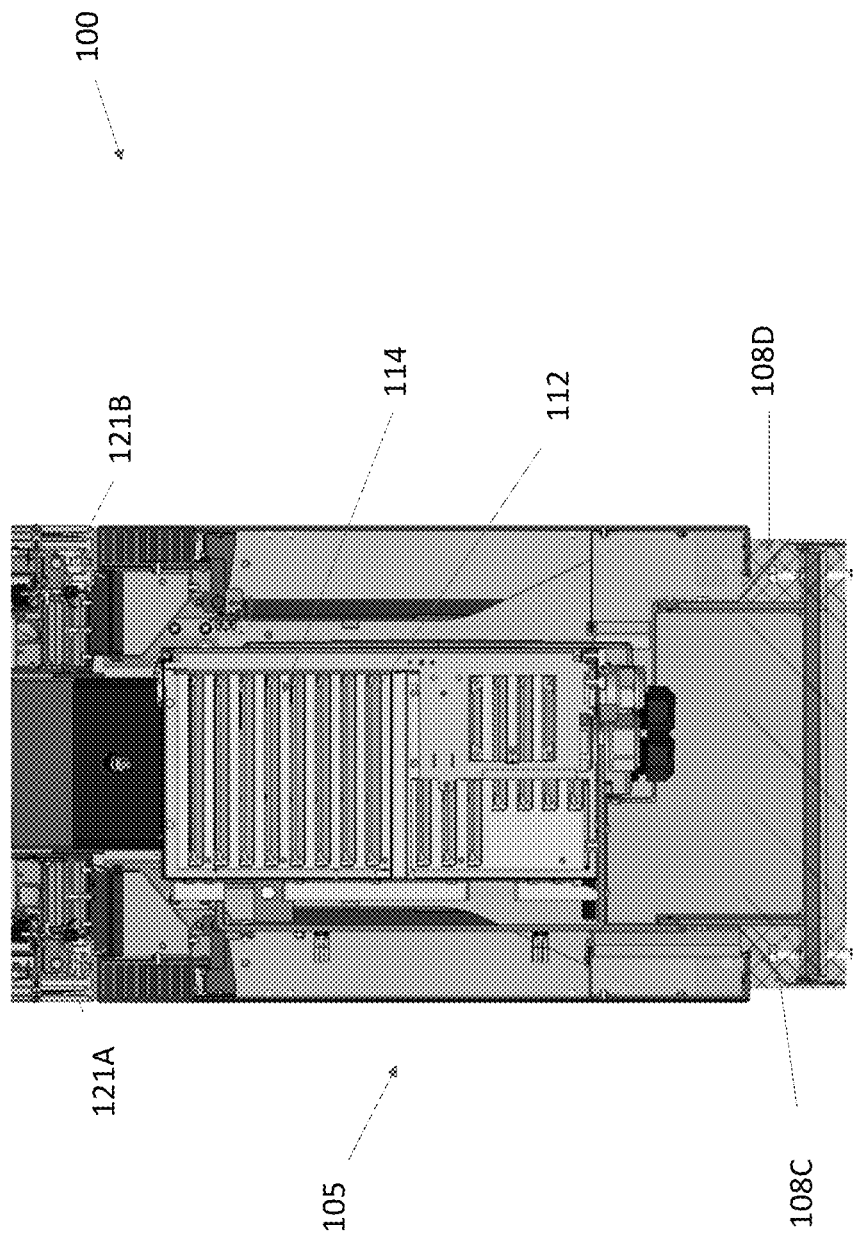
FIG. 10D is a detailed side sectional view of detail B of FIG. 10B.
Figure 10E:
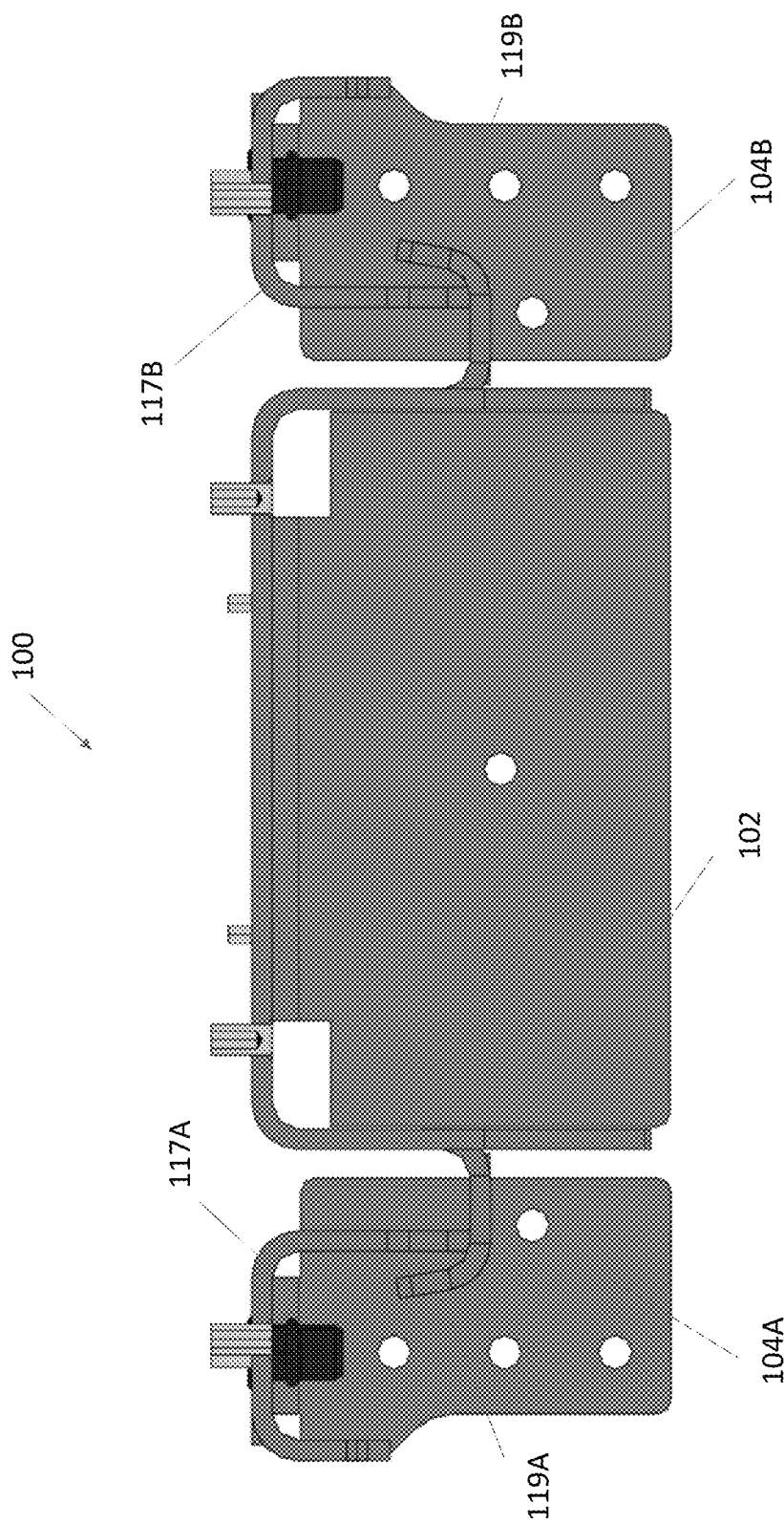
FIG. 10E is a detailed side view of FIG. 10C with certain components shown in isolation.
Figure 11A:
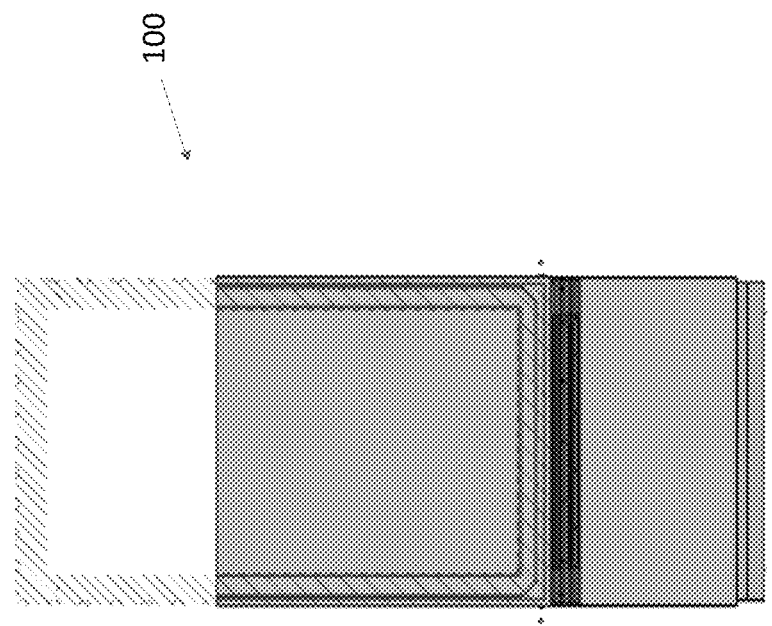
FIG. 11A is a front sectional view of the display assembly of FIG. 1 taken along section line A-A of FIG. 1.

As illustrated with particular regard to at least FIG. 10E, the side assemblies 104 may comprise one or more mounting devices 117. The mounting devices 117 may comprise holes, pins, hooks, bars, protrusions, combinations thereof, or the like. The mounting devices 117A, 117B of the side assemblies 104A, 104B may be configured to mate with one or more mounting devices 119A, 119B of the mounting structure 102. The mounting devices 119 of the mounting structure 102 may comprise holes, pins, hooks, bars, protrusions, combinations thereof, or the like. The mounting devices 117 and/or 119 may be configured to permit hanging or other mounting of the side assemblies 104 at the mounting structure 102 and/or another surface. Securing devices 121A, 121B may be provided at lower portions of the side assemblies 104A, 104B and/or mounting structure 102 for securing the side assemblies 104 to the mounting structure 102 or other surface, such as when the side assemblies 104 are in a closed position. The securing devices 121 may comprise one or more pins, locks, tabs, latches, fasteners, tie downs, combinations thereof, or the like. In exemplary embodiments, the mounting devices 117, 119 comprise complementary hooks which are configured to selectively mate such that the side assemblies 104 may be removably and/or movably mounted to the mounting structure 102. This may permit ease of mounting.

FIG. 12A through FIG. 12C illustrate an exemplary embodiment whereby one of the side assemblies 104 is mounted to a surface 103, such as but not limited to a wall by way of the mounting devices 117, 119. The surface 103 may be another object, such as but not limited to the mounting structure 102, in other exemplary embodiments. The surface 103 and/or other object may serve as a mounting point for the side assemblies 104 by way of the mounting device(s) 119 secured to the surface 103 and/or other object and the mounting devices 117 provided at the side assemblies 104. The mounting devices 117, 119 for accomplishing such mounting are further illustrated in at least FIG. 13A through FIG. 13B.

In exemplary embodiments, without limitation, one or more of the mounting devices 119 may be secured to the surface 103 or object. For example, without limitation, fasteners may be passed through portions of the mounting device 119, such as at holes, slots, and/or otherwise solid, fastener permeable material in a laterally extending bracketing portion 113. Alternatively, or additionally, adhesive, welding, or other bonding techniques may be utilized to secure the mounting device 119 to the surface 103 or object. The mounting device 119 may comprise one or more hooked portions 135. The hooked portions 135 may be provided at laterally extending portions 113 of the mounting device 119 in exemplary embodiments. The hooked portions 135 may be provided at either end of the laterally extending portion 113 and/or spaced apart along the same. Preferably, the laterally extending portions 113 are sized to substantially match (e.g., within about 80%-120%) of the lateral width of the cover layer 120 for the side assembly 104. In other exemplary embodiments, each of the hooked portions 135 may form part of a separate mounting device 119. In yet other exemplary embodiments, multiple mounting devices 119, each with one or more hooked portions 135 are utilized with each side assembly 104.

One or more of the mounting devices 117 may be provided at the side assemblies 104. The mounting devices 117, 119 may be complementary, such as to permit removable mounting of the side assembly 104 to the surface 103. The mounting device(s) 117 may comprise one or more hooked portions 133. Preferably, the hooked portions 133 of the mounting devices 117 associated with the side assemblies 104 face and/or are open in a primarily downward direction while the hooked portions 135 of the mounting devices 119 associated with the surface 103 face and/or are open in a primarily upward facing direction. In this fashion, the hooked portions 133 of the mounting devices 117 associated with the side assemblies 104 may be raised above the hooked portions 135 of the mounting devices 119 associated with, and preferably already mounted to, the surface 103 or other object and slid downward to connect, mount, and secure the side assembly 104 to the surface 103 or another object.

The side assemblies 104, in this fashion, may be capable of rotational movement away from the surface 103 or other object, such as to permit access to a rear portion thereof. Alternatively, or additionally, the side assemblies 104 may be removed by upward movement of the side assemblies 104, such as to disengage the mounting devices 117, 119 from one another. Preferably, eye hooks may be provided (permanently or removably, such as by way of threaded apertures) at upper portions of the side assemblies to permit upward movement by attached crane or another device. The side assemblies 104 may be moved laterally outward to clear the mounting devices 117, 119 from each other, then lowered or otherwise moved to another location as desired.

The hooked portions 133 of the mounting devices 117 associated with the side assemblies 104 may be provided at laterally extending portions 111. The hooked portions 133 may be provided at either end of the laterally extending portion 111 and/or spaced apart along the same. Preferably, the laterally extending portions 111 are sized to substantially match (e.g., within about 80%-120%) of the lateral width of the cover layer 120 for the side assembly 104. The mounting devices 117 of the side assemblies 104 may be removably or permanently attached to the side assemblies 104 and/or integrally formed therewith.

One or both of the laterally extending portions 111, 113 may comprise apertures, such as for reduced weight, airflow, and/or accepting fasteners for securing the mounting devices 111, 113 to the surface 103 and/or other portion of the side assembly 104.

Figure 14C:
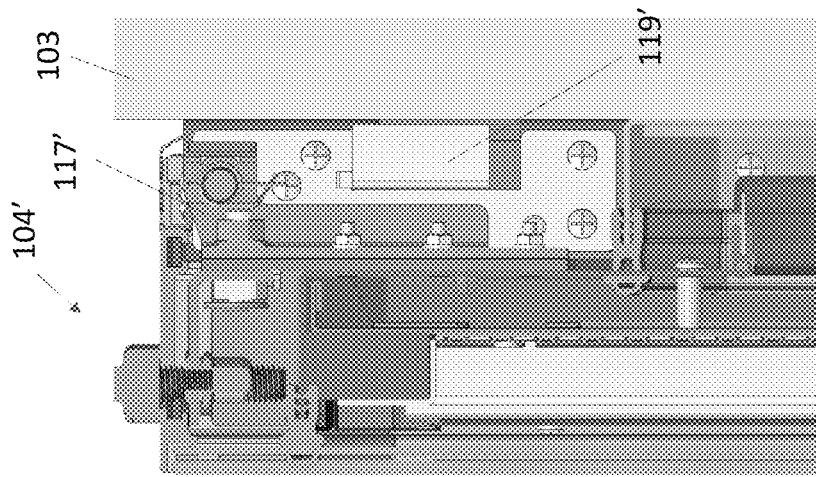
FIG. 14C is a detailed side view of detail D of FIG. 14B.
Figure 14B:
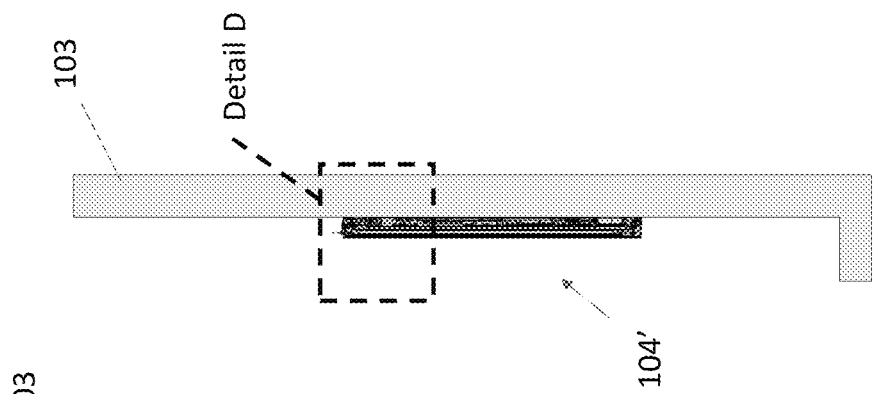
FIG. 14B is a side sectional view of the installed side assembly of FIG. 14A taken along section line D-D.
Figure 14A:
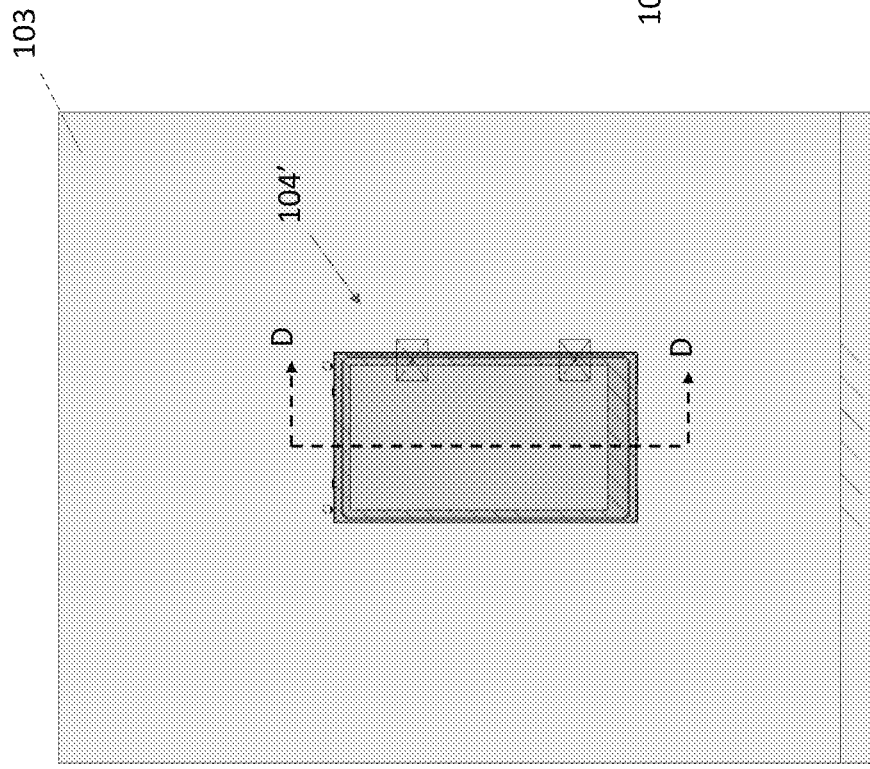
FIG. 14A is a front view of another exemplary embodiment of the side assembly separately installed to the exemplary surface in another exemplary fashion.
Figures 15A, 15B:
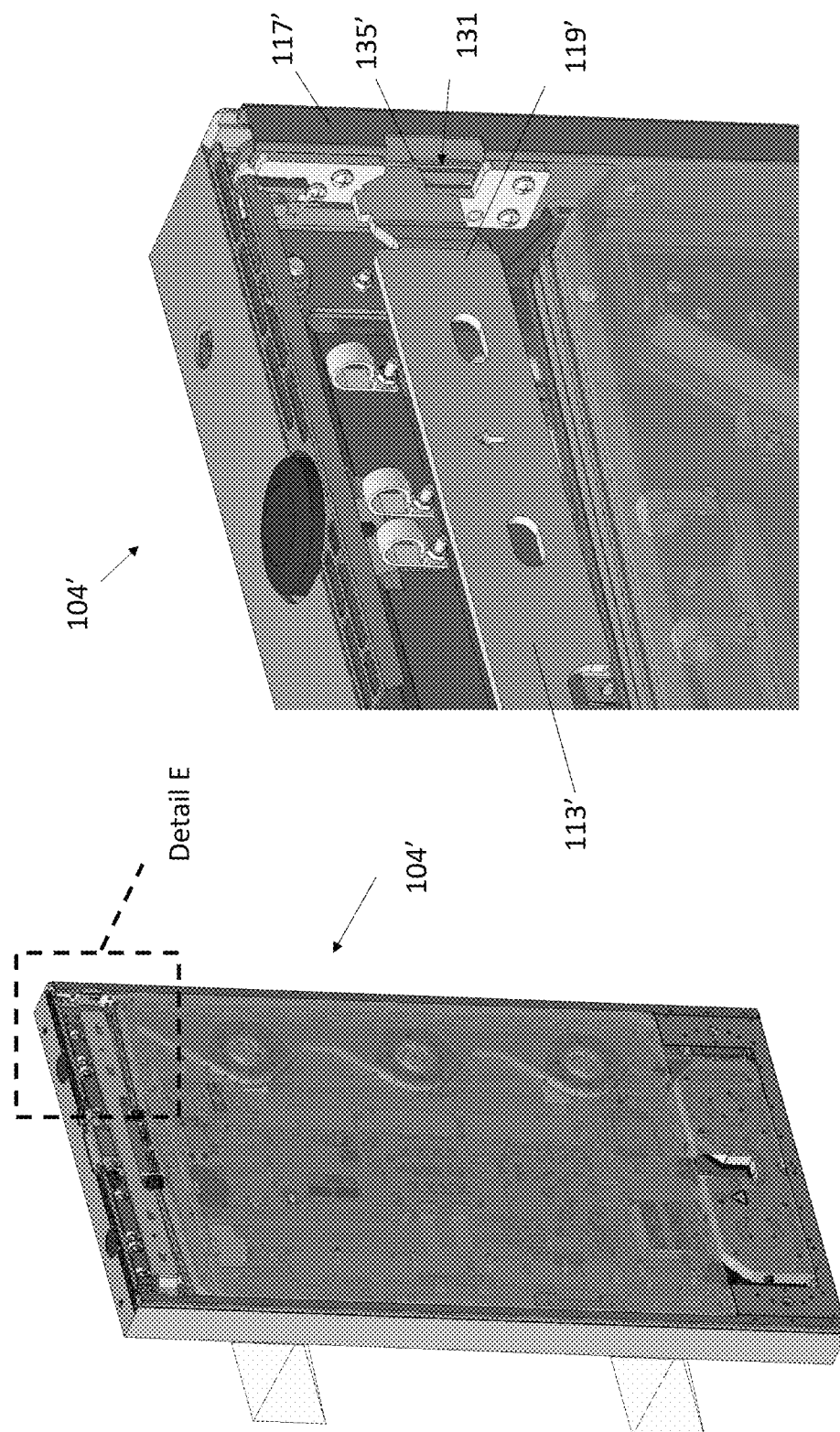
FIG. 15A is a perspective view of an exemplary mounting structure of FIGS. 14A-14C shown in insolation.
FIG. 15B is a detailed perspective view of the mounting structure of detail E of FIG. 15A.
Figure 15D:
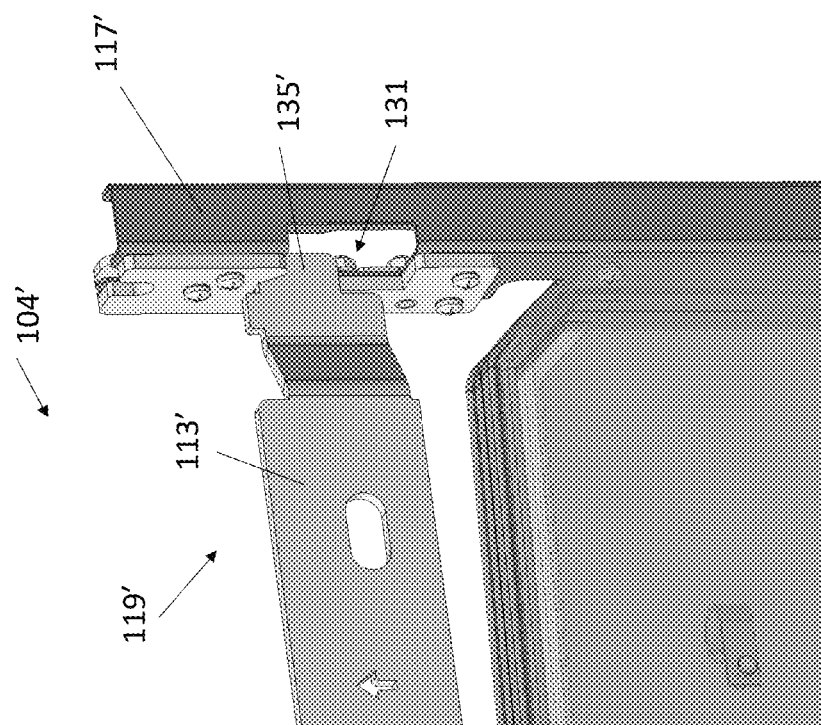
FIG. 15D is a detailed perspective view of the mounting structure of FIGS. 15A-15B with certain components not illustrated so that other features may be better seen.
Figure 15C:
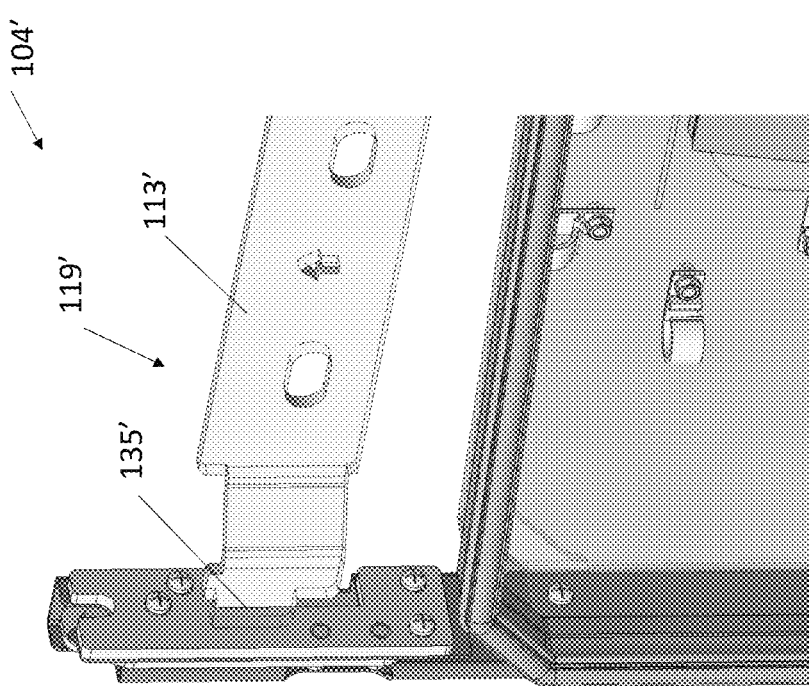
FIG. 15C is a detailed perspective view of the mounting structure of FIGS. 15A-15B with certain components not illustrated so that other features may be better seen.
Figure 16A:
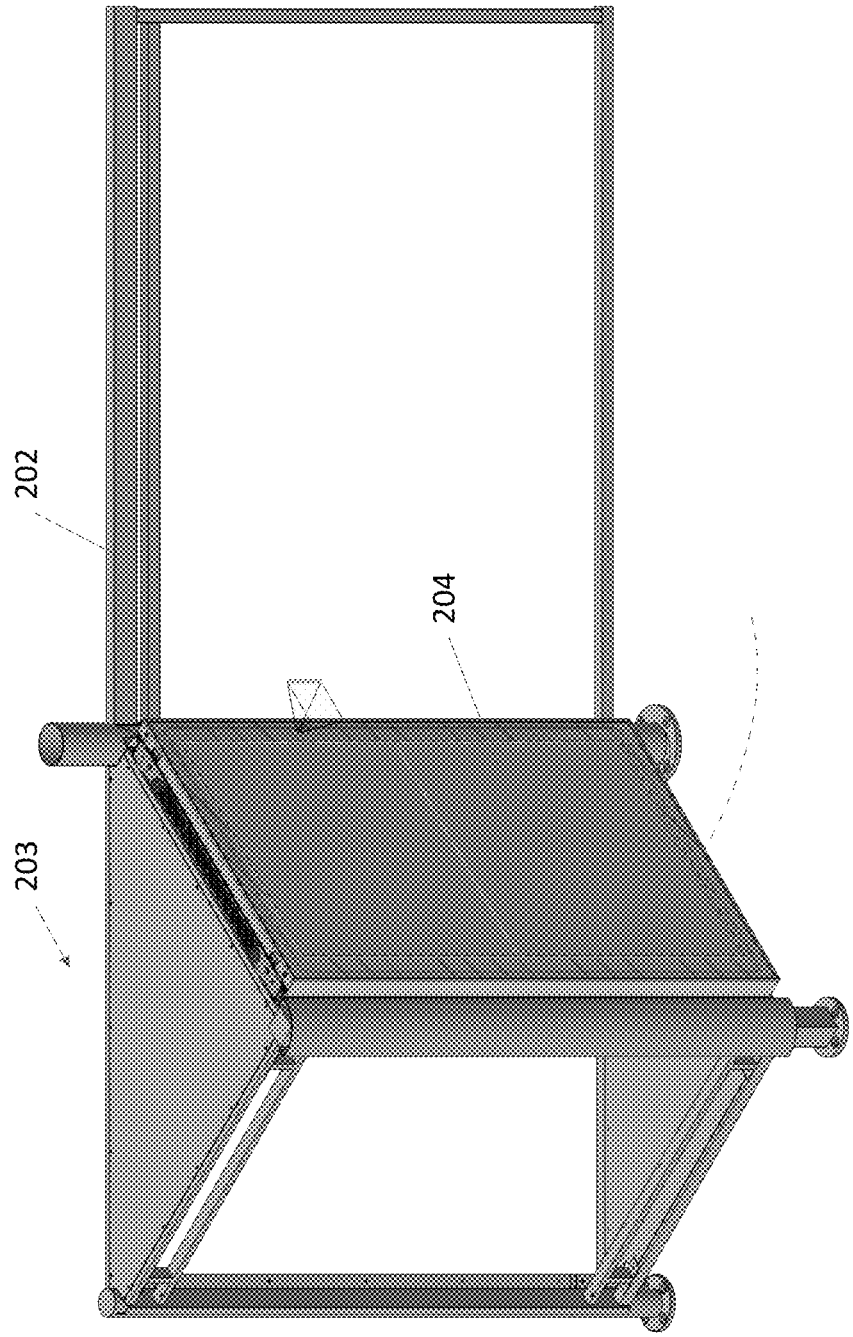
FIG. 16A is a perspective view of an exemplary mounted display.
Figure 16C:
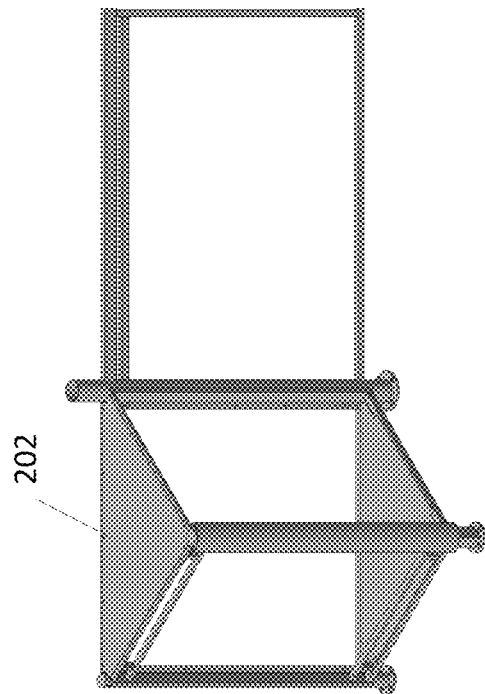
FIG. 16C is the perspective view of FIG. 16B with the mounting structure further retrofitted.
Figure 16B:
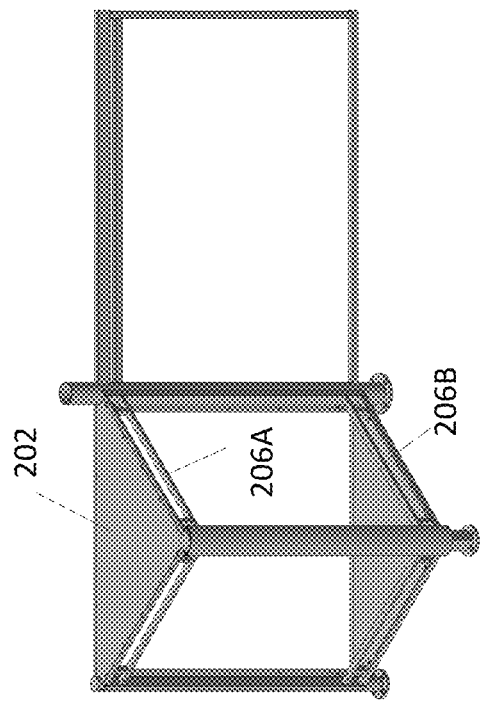
FIG. 16B is a perspective view of an exemplary mounting structure of FIG. 16A partially retrofitting to accommodate an exemplary display assembly.
Figure 16E:
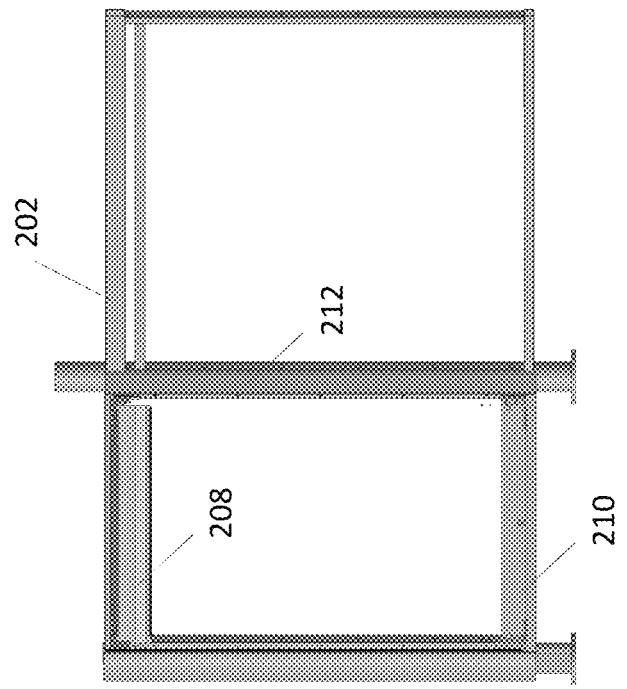
FIG. 16E is the perspective view of FIG. 16D with the mounting structure further retrofitted.
Figure 16D:
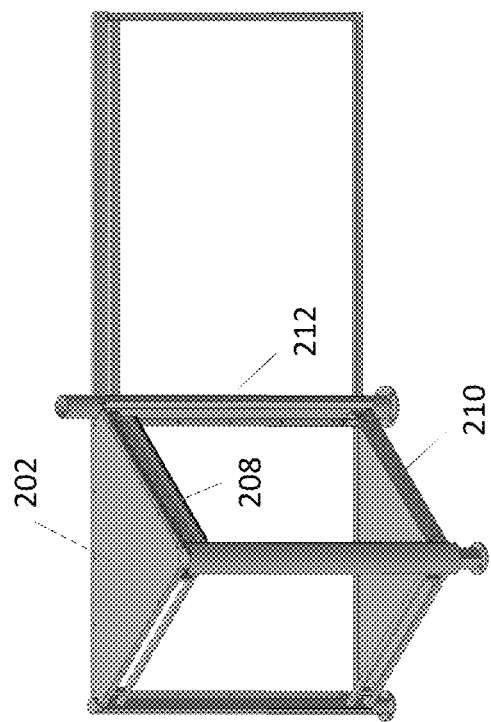
FIG. 16D is the perspective view of FIG. 16C with the mounting structure further retrofitted.
Figure 16F:
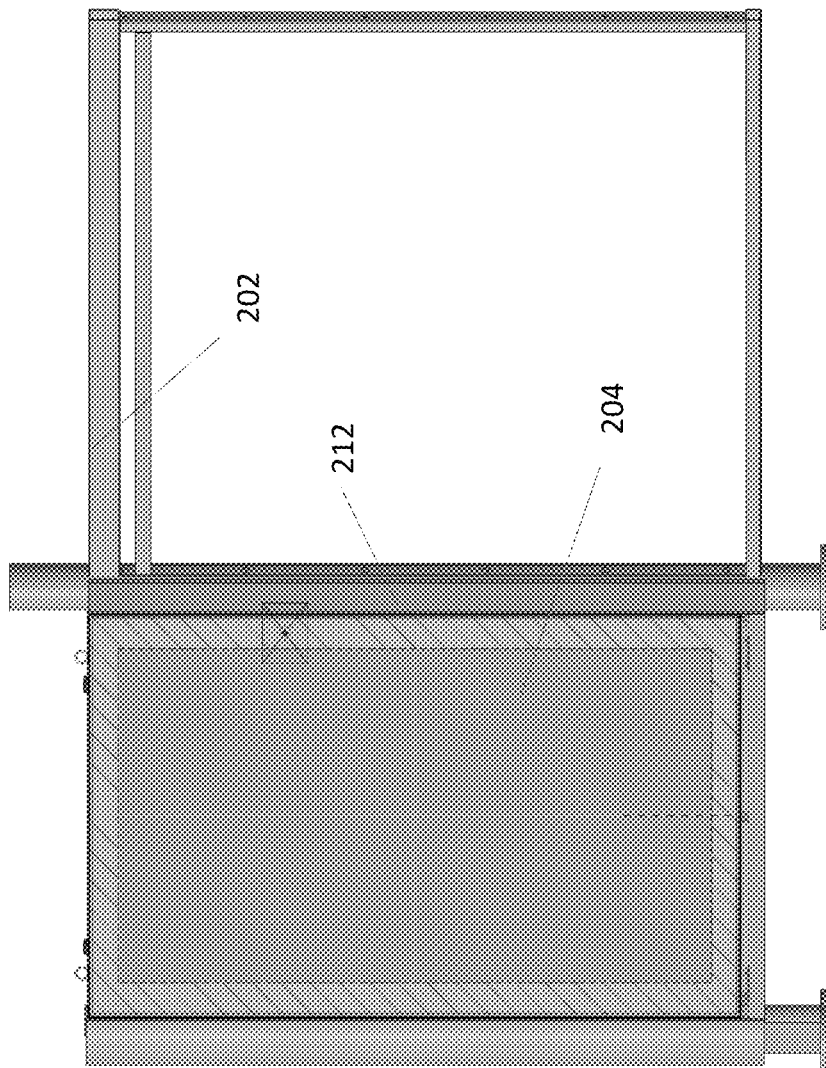
FIG. 16F is a side view of the mounted display of FIG. 16E.
Figure 17B:
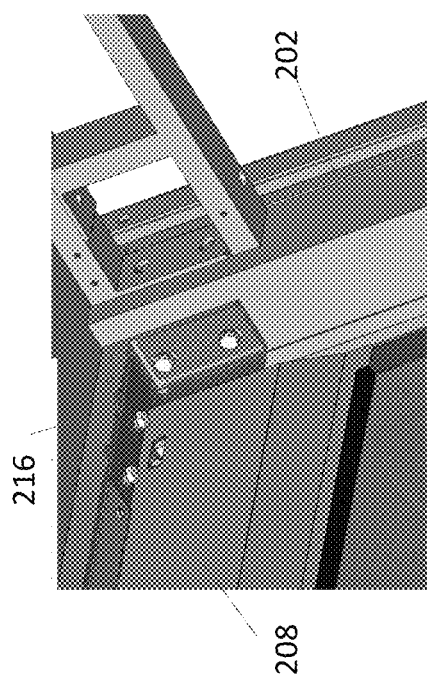
FIG. 17B is a detailed perspective view of the mounted display of FIGS. 16A and 16F.
Figure 17C:
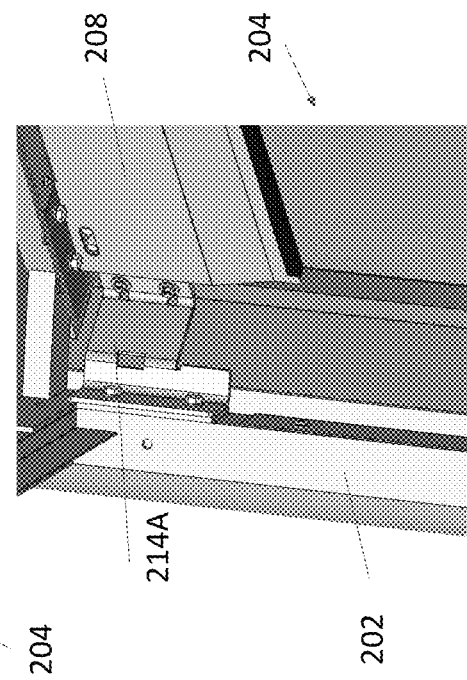
FIG. 17C is another detailed perspective view of the mounted display of FIGS. 16A and 16F.
Figure 17A:
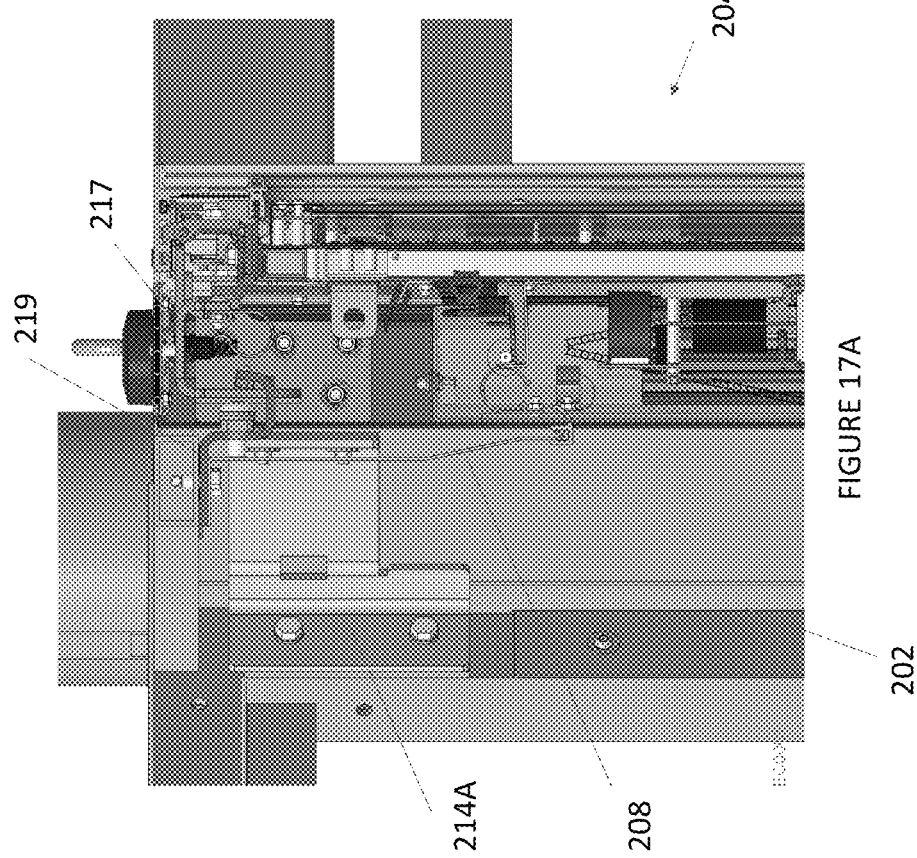
FIG. 17A is a detailed side sectional view of the mounted display of FIGS. 16A and 16F.

FIG. 14A through FIG. 14C illustrate another exemplary embodiment whereby other exemplary mounting devices 117', 119' are used to mount other exemplary side assemblies 104' to the same or other surfaces 103 or other object(s). Same or similar components may be numbered similarly but with the addition of a prime (') (e.g., 117 to 117'). These mounting devices 117', 119' may be, for example without limitation, preferably used with relatively smaller size side assemblies 104' with relatively smaller size displays. These side assemblies 104' may be relatively lighter and thus reduced size mounting devices 117', 119' may be utilized in some embodiments.

In exemplary embodiments, without limitation, the mounting devices 117' associated with the side assemblies 104' may comprise one or more apertures 131, which may be formed as slots. The apertures 131 may be configured to accept hooked portions 135' of the mounting device 119' associated with the surface 103 or other structure. The hooked portions 135' may be provided at either end of a laterally extending portion 113'. The mounting devices 117' associated with the side assembly 104 may be provided at either side of the side assembly 104 to receive the hooked portions 135' in the apertures 131. Two mounting devices 117', in exemplary embodiments, may be provided at each side assembly 104 with a single mounting device 119' associated with the surface 103. The hooked portions 135' may extend laterally and/or depth wise to engage the apertures 131 which may be open in a lateral direction by way of non-limiting example.

Any size, shape, number, and/or kind mounting device 117, 119, 117', 119' with any size, shape, number, and/or kind of components may be provided in any arrangement, preferably in a complementary fashion to permit removable mounting of the side assemblies 104, 104' to surfaces 103. After mounting, the side assemblies 104, 104' may be connected to external power supply and/or communication as need for operation. However, as the side assemblies 104, 104' may be otherwise independent (e.g., self-contained from an airflow perspective), the mounting devices 117, 119, 117', 119' may provide easy of mounting and removal.

The mounting devices 119, 119' may be mounted to one a wall, building, item of street furniture (e.g., a bus shelter, junction box, telephone booth, lamp pole, etc.), or other surface. In this fashion, the side assembly 104 may be so mounted to various locations. In exemplary embodiments, without limitation, the mounting devices 119, 119' may be connected to and/or integrally formed with, laterally support members for such walls, buildings, items of street furniture, or the like. For example, without limitation, the laterally extending portions 113, 113' of the mounting devices 119, 119' may comprise laterally extending support members of a bus shelter.

FIG. 16A through FIG. 16F illustrate an exemplary embodiment whereby a display unit 204 is mounted to an existing bus shelter 202. While a bus shelter 202 is discussed, other structures may be utilized, such as but not limited to, various items of street furniture. The display unit 204 may comprise some or all of the components of the side assemblies 104, 104' and/or display assembly 100. Furthermore, while an approach for retrofitting existing bus shelters 202 is sometimes shown and/or discussed, the components, systems, apparatus, methods, and/or the like may be used for new structures.

Bus shelters 202 and/or other structures sometimes comprise areas 203 for mounting advertising or other signage, such as static poster holders. As illustrated with particular regard to at least FIG. 16B, the areas 203 may comprise upper and/or lower rails 206A, 206B for mounting static poster holders and related components. As illustrated with particular regard to at least FIG. 16C, a retrofitting process may comprise removing such rails 206A, 206B and related components. As illustrated with particular regard to at least FIGS. 16D-16E, the retrofitting process may comprise installing an upper panel 208, a lower panel 210, and/or one or more side panels 212 to the area 203. As illustrated with particular regard to at least FIG. 16F, the display unit 204 may be installed to the area 203.

FIG. 17A through FIG. 17F illustrate the mounted display unit 204 in further detail. As illustrated with particular regard to at least FIGS. 17A and 17C, side brackets 214A may be provided which attach the upper panel 208 to the existing structure 202. A corresponding side bracket 214A may be provided on each side (right and left) of the display unit 204 in exemplary embodiments, without limitation. A mounting device 219 may be attached to the existing structure 202, the side panel 214A, and/or the front panel 208. The mounting device 219 may comprise a preferably upward facing hook portion configured to interact with a mounting device 217 within the display unit 204, which preferably faces downward. Other orientations, including the reverse, may be utilized.

The mounting device 219, 217 may facilitate hanging the display unit 204 from the structure 202. The mounting device 219 may be secured to one or more of side members and/or an upper member of the structure 202. The side brackets 214 may be secured to the side members of the structure 202. The upper panel 208 may be provided, at least in part, to ensure that most or all ambient air is drawn from a space above the structure 202, for example because the air within the area 203 may be relatively warm. The upper panel 208 may be adapted to draw air from various areas, such as with other structures 202. A gasket may be provided at the upper panel 208 to enhance sealing and/or separation of airflows.

As illustrated with particular regard to at least FIGS. 17D-17F, side brackets 214B may be provided at a lower portion of the structure 202, such as to secure the lower panel 210. The lower panel 210 and/or side brackets 214B may serve as a mounting point for a lower portion of the display unit 204, which may be secured by one or more bolts or other fasteners through the lower panel 210 and/or side brackets 214B.

Any embodiment of the present invention may include any of the features of the other embodiments of the present invention. The exemplary embodiments herein disclosed are not intended to be exhaustive or to unnecessarily limit the scope of the invention. The exemplary embodiments were chosen and described in order to explain the principles of the present invention so that others skilled in the art may practice the invention. Having shown and described exemplary embodiments of the present invention, those skilled in the art will realize that many variations and modifications may be made to the described invention. Many of those variations and modifications will provide the same result and fall within the spirit of the claimed invention.

Certain operations described herein may be performed by one or more electronic devices. Each electronic device may comprise one or more processors, electronic storage devices, executable software instructions, combinations thereof, and the like configured to perform the operations described herein. The electronic devices may be general purpose computers or specialized computing devices. The electronic devices may comprise personal computers, smartphone, tablets, databases, servers, or the like. The electronic connections and transmissions described herein may be accomplished by wired or wireless means. The computerized hardware, software, components, systems, steps, methods, and/or processes described herein may serve to improve the speed of the computerized hardware, software, systems, steps, methods, and/or processes described herein.

What is claimed is:

1. A system for mounting display assemblies, said system comprising:
   a first mounting device comprising a laterally extending portion and hooked portions facing, at least primarily, in a first direction; and
   a side assembly comprising a display layer and a backlight, and a second mounting device located, at least in part, rearward of at least a viewing surface of the display layer, said second mounting device comprising a laterally extending portion and hooked portions facing, at least primarily, in a second direction;
   wherein the first mounting device is configured to receive the side assembly by raising the side assembly relative to, and independently from, the first mounting device such that said hooked portions of said second mounting device are positioned to clear the hooked portions of the first mounting device, moving the side assembly laterally rearward such that the hooked portions of the second mounting device at least partially overlap at least a subset of the hooked portions of the first mounting device, and lowering the side assembly to engage at least the subset of the hooked portions of the first mounting device with the hooked portions of the second mounting device.

2. The system of claim 1 wherein:
the first direction is a downward facing direction; and
the second direction is an upward facing direction.

3. The system of claim 1 wherein:
the laterally extending portion comprises holes for receiving fasteners for connecting the first mounting device to a wall or other surface.

4. The system of claim 1 further comprising:
a structural framework, wherein the first mounting device is provided at, connected to, or forms part of, the structural framework.

5. The system of claim 4 further comprising:
a second side assembly comprising a second display layer, a second backlight, and a third mounting device located, at least in part, rearward of at least a viewing surface of the second display layer, said third mounting device comprising a laterally extending portion and hooked portions facing, at least primarily, in the second direction, wherein the first mounting device is configured to receive the second side assembly at a different side of said structural framework from said side assembly by raising the second side assembly relative to the first mounting device such that said hooked portions of said third mounting device are positioned to clear at least a further subset of the hooked portions of the first mounting device unoccupied by the side assembly, moving the second side assembly laterally rearward such that the hooked portions of the third mounting device at least partially overlap the further subset of the hooked portions of the first mounting device, and lowering the second side assembly to engage the further subset of the hooked portions of the first mounting device with the further subset of the hooked portions of the third mounting device.

6. The system of claim 5 wherein:
the subset of the hooked portion of the first mounting device are located at a first side of the laterally extending portion and the further subset of the hooked portion of the first mounting device are located at a second side of the laterally extending portion.

7. The system of claim 6 wherein:
the side assembly and the second side assembly are configured to be removably secured to opposing sides of the structural framework.

8. The system of claim 1 further comprising:
eyehooks provided to the side assembly for connecting the side assembly to a crane for raising the side assembly.

9. The system of claim 1 wherein:
the second mounting device is located at a rear surface of the side assembly.

10. The system of claim 1 wherein:
the side assembly comprises a cover, wherein the display layer is located behind the cover;
the laterally extending portion of the second mounting device has a length that is within 80%-120% of a width of the cover; and
the laterally extending portion of the first mounting device has a length that is within 80%-120% of the width of the cover.

11. The system of claim 1 wherein:
the side assembly comprises:
   an open loop airflow pathway extending within the side assembly;
   a closed loop airflow pathway extending within the side assembly; and
   one or more fans located along the closed loop airflow pathway.

12. The system of claim 1 wherein:
the side assembly comprises a cover layer located forward of the display layer and at least one fan assembly; and
the display layer, backlight, cover layer, and at least one fan assembly are structurally interconnected by way of at least the second mounting device.

13. The system of claim 12 wherein:
the side assembly is supported by the first mounting device when connected.

14. A display assembly with integrated mounting system, said display assembly comprising:
a structural framework;
a first mounting device provided at, connected to, or forming part of the structural framework and comprising a laterally extending portion and hooked portions facing, at least primarily, in a first direction; and
a side assembly comprising a cover layer, a display layer, located rearward of the cover layer, a backlight located rearward of the display layer, at least one fan assembly, and a second mounting device positioned rearward of at least a viewing surface of the display layer, said second mounting device comprising a laterally extending portion and hooked portions facing, at least primarily, in a second direction, wherein the cover layer, the display layer, the backlight, and at least one fan assembly are structurally interconnected by way of at least the second mounting device;
wherein the first mounting device is configured to receive the side assembly by raising the side assembly relative to, and independently from, the first mounting device such that at least a subset of said hooked portions of said second mounting device are positioned to clear the hooked portions of the first mounting device, moving the side assembly laterally rearward such that said hooked portions of the second mounting device at least partially overlap at least the subset of hooked portions of the first mounting device, and lowering the side assembly to engage at least the subset of hooked portions of the first mounting device with the hooked portions of the second mounting device.

15. The display assembly of claim 14 further comprising:
a second side assembly comprising a second display layer and a third mounting device positioned rearward of at least a viewing surface of the second display layer, said third mounting device comprising a laterally extending portion and hooked portions facing, at least primarily, in the second direction, wherein the first mounting device is configured to receive the second side assembly at a second, opposing side of the structural framework from the side assembly by raising the second side assembly relative to, and independently from, the first mounting device such that said hooked portions of said third mounting device are positioned to clear a further subset the hooked portions of the first mounting device unoccupied by the side assembly, moving the second side assembly laterally rearward such that the hooked portions of the third mounting device at least partially overlap at least the further subset of the hooked portions of the first mounting device, and lowering the second side assembly to engage at least the further subset of the hooked portions of the first mounting device with the hooked portions of the third mounting device.

16. The display assembly of claim 15 wherein:
the first direction is a downward facing direction; and
the second direction is an upward facing direction.

17. The display assembly of claim 16 wherein:
the side assembly comprises a cover, wherein the display layer is located behind the cover;
the laterally extending portion of the second mounting device has a length that is within 80%-120% of a width of the cover; and
the laterally extending portion of the first mounting device has a length that is within 80%-120% of the width of the cover.

18. The display assembly of claim 14 wherein:
the laterally extending portion of the first mounting device comprises holes for receiving fasteners for connecting the first mounting device to a wall or other surface.

19. A display assembly with integrated mounting system, said display assembly comprising:
a structural framework;
a first mounting device provided at, connected to, or forming part of the structural framework and comprising a laterally extending portion and hooked portions facing, at least primarily, in a first, upward facing direction, wherein a first portion of said hooked portions is provided at a first side of the first mounting device and a second portion of said hooked portions is provided at a second side of the first mounting device; and
side assemblies, each comprising a directly backlit liquid crystal electronic display behind a cover layer and an additional mounting device positioned rearward of at least a viewing surface of the electronic display, each of said additional mounting devices comprising a laterally extending portion and hooked portions facing, at least primarily, in a second, downward facing direction;
wherein the first mounting device is configured to receive each of the side assemblies by raising the side assemblies relative to the first mounting device such that said hooked portions of each of said additional mounting devices are positioned to clear the hooked portions of the first mounting device, moving the side assemblies laterally rearward such that the hooked portions of the additional mounting devices at least partially overlap at least a respective subset of the hooked portions at a respective side of the first mounting device, and lowering the side assemblies to engage the respective subset of the hooked portions of the first mounting device with the hooked portions of the additional mounting devices.

20. The display assembly of claim 19 wherein:
the laterally extending portion of the second mounting device has a length that is within 80%-120% of a width of the cover layer; and
the laterally extending portion of the first mounting device has a length that is within 80%-120% of the width of the cover layer.

* * * * *

UNITED STATES PATENT AND TRADEMARK OFFICE
CERTIFICATE OF CORRECTION

| | | |
|---|---|---|
| PATENT NO. | : 12,393,069 B2 | Page 1 of 1 |
| APPLICATION NO. | : 18/962069 | |
| DATED | : August 19, 2025 | |
| INVENTOR(S) | : William Dunn et al. | |

It is certified that error appears in the above-identified patent and that said Letters Patent is hereby corrected as shown below:

On the Title Page

Item (56), References Cited, U.S. Patent Documents, please delete "7,212,403 B2 5/2007 Rockenfell" and insert -- 7,212,403 B2 5/2007 Rockenfeller --.

In the Specification

In Column 5, Line 54, please delete "1080" and insert -- 108C --.

Signed and Sealed this
Fourteenth Day of October, 2025

John A. Squires
*Director of the United States Patent and Trademark Office*